US008906718B2

(12) United States Patent
Sonoda et al.

(10) Patent No.: US 8,906,718 B2
(45) Date of Patent: Dec. 9, 2014

(54) METHOD FOR FORMING VAPOR DEPOSITION FILM, AND METHOD FOR PRODUCING DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/976,437

(22) PCT Filed: Dec. 20, 2011

(86) PCT No.: PCT/JP2011/079441
§ 371 (c)(1),
(2), (4) Date: Jun. 26, 2013

(87) PCT Pub. No.: WO2012/090771
PCT Pub. Date: Jul. 5, 2012

(65) Prior Publication Data
US 2013/0280839 A1    Oct. 24, 2013

(30) Foreign Application Priority Data

Dec. 27, 2010    (JP) ................................ 2010-291201

(51) Int. Cl.
*H01L 21/00*    (2006.01)
*H01L 21/02*    (2006.01)
(Continued)

(52) U.S. Cl.
CPC ...... *H01L 21/02104* (2013.01); *H01L 27/3211* (2013.01); *H01L 51/524* (2013.01); *H01L 51/56* (2013.01); *H05B 33/04* (2013.01); *H05B 33/10* (2013.01); *H01L 33/005* (2013.01); *H01L 51/0011* (2013.01); *C23C 14/042* (2013.01); *C23C 16/042* (2013.01); *H01L 2251/566* (2013.01)
USPC ............. 438/29; 438/669; 438/670; 438/671; 438/680; 438/780; 257/40; 257/79; 313/499; 313/501

(58) Field of Classification Search
CPC ............ H01L 51/0011; H01L 27/3283; H01L 51/5012; H01L 21/02104; H01L 2227/323; H01L 2251/5361; H01L 51/001; H01L 2924/12044
USPC ........ 257/40, E51.018, 79, 88; 313/499, 501; 438/29, 669–671, 680, 780
See application file for complete search history.

(56) References Cited

U.S. PATENT DOCUMENTS 4,420,365 A    12/1983   Lehrer
5,742,129 A *  4/1998    Nagayama et al. ........... 315/167
(Continued)

FOREIGN PATENT DOCUMENTS

JP    8-227276 A    9/1996
JP    10-102237 A   4/1998
(Continued)

OTHER PUBLICATIONS

International Search Report received for PCT Patent Application No. PCT/JP2011/079441, mailed on Feb. 7, 2012, 4 pages (2 pages of English Translation and 2 pages of Search Report).
(Continued)

*Primary Examiner* — Bac Au
(74) *Attorney, Agent, or Firm* — Morrison & Foerster LLP

(57) ABSTRACT

On a surface of a substrate (3) on which surface a vapor-deposited film is to be formed, a photoresist (13) is formed so as to have an opening in a sealing region including a display region (R1) which sealing region is formed by a sealing resin (11) of a frame shape. Then, luminescent layers (8R, 8G, and 8B) having a striped pattern are formed. Subsequently, the photoresist (13) is removed with the use of an exfoliative solution so as to form the luminescent layers (8R, 8G, and 8B) patterned with high definition.

19 Claims, 16 Drawing Sheets

(51) Int. Cl.
 *H01L 27/32* (2006.01)
 *H01L 51/52* (2006.01)
 *H01L 51/56* (2006.01)
 *H05B 33/04* (2006.01)
 *H05B 33/10* (2006.01)
 *H01L 33/00* (2010.01)
 *H01L 51/00* (2006.01)
 *C23C 14/04* (2006.01)
 *C23C 16/04* (2006.01)

(56) References Cited

U.S. PATENT DOCUMENTS

| | | | |
|---|---|---|---|
| 6,294,892 B1 | 9/2001 | Utsugi et al. | |
| 6,378,199 B1 | 4/2002 | Yoshinuma et al. | |
| 6,410,445 B1* | 6/2002 | Fagerman | 438/695 |
| 7,598,668 B2 | 10/2009 | Oyamada et al. | |
| 2006/0228477 A1* | 10/2006 | Zhang et al. | 427/249.1 |
| 2008/0024873 A1 | 1/2008 | Kim et al. | |
| 2009/0136877 A1* | 5/2009 | Suganuma | 430/325 |
| 2009/0184636 A1* | 7/2009 | Cok | 313/505 |

FOREIGN PATENT DOCUMENTS

| | | |
|---|---|---|
| JP | 10-261486 A | 9/1998 |
| JP | 2000-164353 A | 6/2000 |
| JP | 2000-188179 A | 7/2000 |
| JP | 2001-118679 A | 4/2001 |
| JP | 2002-367774 A | 12/2002 |
| JP | 2006-317762 A | 11/2006 |
| JP | 2010-108706 A | 5/2010 |

OTHER PUBLICATIONS

International Search Report received for PCT Patent Application No. PCT/JP2011/079439, mailed on Feb. 7, 2012, 5 pages (2 pages of English Translation and 3 pages of Official copy).

International Preliminary Report on Patentability received for PCT Patent Application No. PCT/JP2011/079441, mailed on Jul. 11, 2013, 12 pages (7 pages of English Translation and 5 pages of IPRP).

International Preliminary Report on Patentability received for PCT Patent Application No. PCT/JP2011/079439, mailed on Jul. 11, 2013, 14 pages (8 pages English Translation and 6 pages IPRP).

Non Final Office Action received for U.S. Appl. No. 13/976,422, mailed on May 28, 2014, 9 pages.

\* cited by examiner

FIG. 3

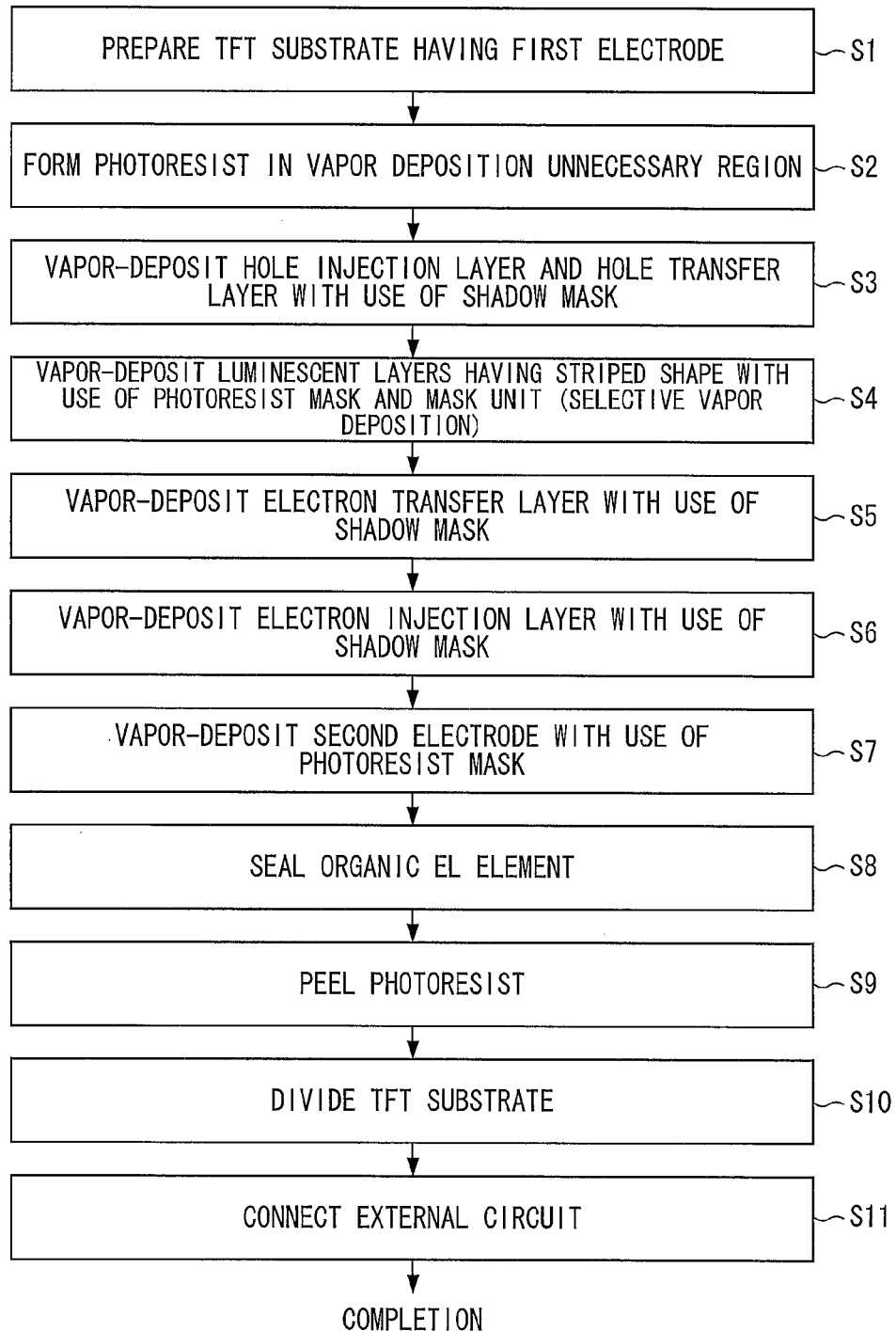

- PREPARE TFT SUBSTRATE HAVING FIRST ELECTRODE — S1
- FORM PHOTORESIST IN VAPOR DEPOSITION UNNECESSARY REGION — S2
- VAPOR-DEPOSIT HOLE INJECTION LAYER AND HOLE TRANSFER LAYER WITH USE OF SHADOW MASK — S3
- VAPOR-DEPOSIT LUMINESCENT LAYERS HAVING STRIPED SHAPE WITH USE OF PHOTORESIST MASK AND MASK UNIT (SELECTIVE VAPOR DEPOSITION) — S4
- VAPOR-DEPOSIT ELECTRON TRANSFER LAYER WITH USE OF SHADOW MASK — S5
- VAPOR-DEPOSIT ELECTRON INJECTION LAYER WITH USE OF SHADOW MASK — S6
- VAPOR-DEPOSIT SECOND ELECTRODE WITH USE OF PHOTORESIST MASK — S7
- SEAL ORGANIC EL ELEMENT — S8
- PEEL PHOTORESIST — S9
- DIVIDE TFT SUBSTRATE — S10
- CONNECT EXTERNAL CIRCUIT — S11
- COMPLETION

F I G. 7
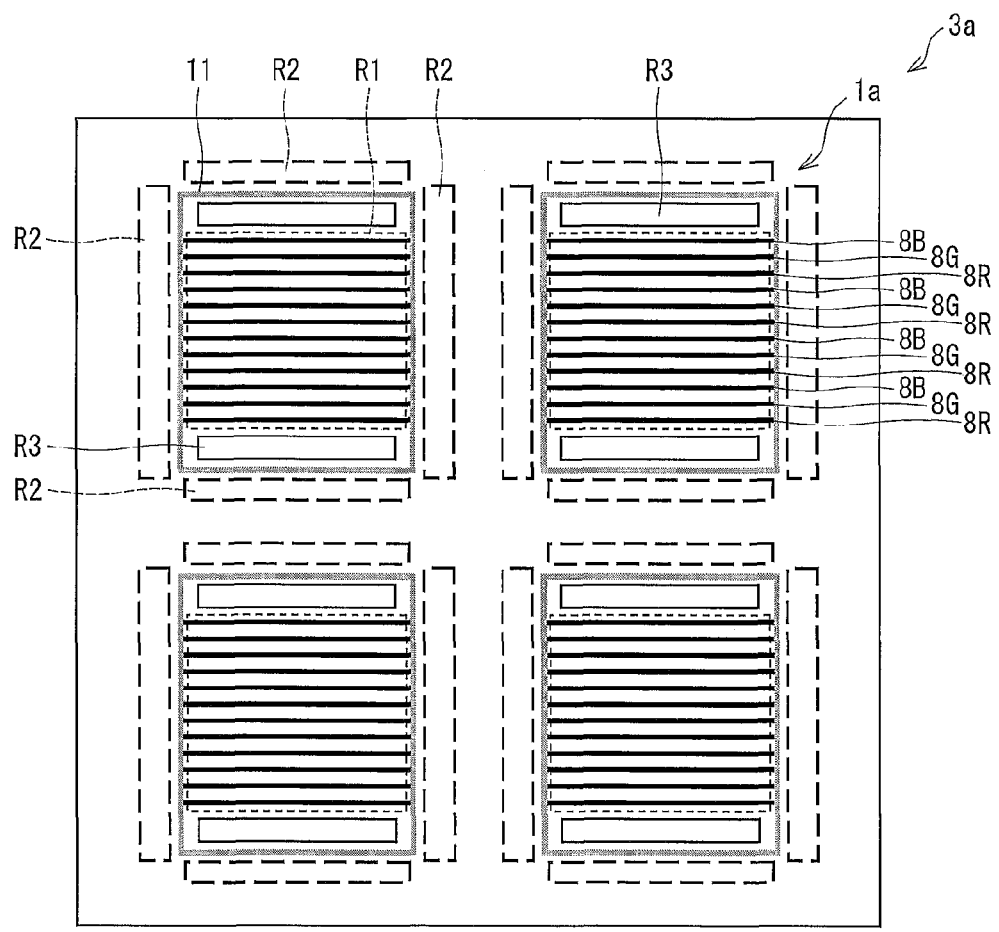

METHOD FOR FORMING VAPOR DEPOSITION FILM, AND METHOD FOR PRODUCING DISPLAY DEVICE

CROSS REFERENCE TO RELATED APPLICATIONS

This is a U.S. National Phase patent application of PCT/JP2011/079441, filed Dec. 20, 2011, which claims priority to Japanese patent application no. 2010-291201, filed Dec. 27, 2010, each of which is hereby incorporated by reference in the present disclosure in its entirety.

TECHNICAL FIELD

The present invention relates to (i) a method for forming a vapor-deposited film patterned in a predetermined shape and (ii) a method for producing a display device including the vapor-deposited film patterned in the predetermined shape.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, self-emitting, and wide viewing angle characteristics.

An organic EL display device includes, for example, (i) a substrate made up of members such as a glass substrate and TFTs (thin film transistors) provided to the glass substrate and (ii) organic EL elements provided on the substrate and connected to the TFTs.

For example, a full-color organic EL display device typically includes, as sub-pixels aligned on a substrate, organic EL elements including luminescent layers of red (R), green (G), and blue (B). The full-color organic EL display device carries out an image display by, with use of TFTs, selectively causing the organic EL elements to each emit light with a desired luminance.

In order to produce an organic EL display device, it is therefore necessary to form, for each organic EL element, a luminescent layer of a predetermined pattern made of an organic luminescent material which emits light of the colors.

Such formation of a luminescent layer of a predetermined pattern is performed by a method such as (i) a vacuum vapor deposition method, (ii) an inkjet method, and (iii) a laser transfer method. The production of, for example, a low-molecular organic EL display (OLED) often uses a vapor deposition method.

The vacuum vapor deposition method uses a mask (referred to also as a shadow mask) provided with openings of a predetermined pattern. The mask is fixed in close contact with a vapor-deposited surface of a substrate which vapor-deposited surface faces a vapor deposition source.

Then, vapor deposition particles (film formation material) are injected from the vapor deposition source so as to be deposited on the vapor-deposited surface through openings of the mask. This forms a thin film of a predetermined pattern. The vapor deposition is carried out for each color of a luminescent layer. This is called "selective vapor deposition".

Patent Literatures 1 and 2 each disclose a selective vapor deposition method in which luminescent layers of respective colors are formed by shifting a mask bit by bit with respect to a substrate.

Such a conventional selective vapor deposition method uses a mask that has a substantially same size as a substrate. During vapor deposition, the mask is fixed so as to cover a vapor-deposited surface of the substrate.

Accordingly, the conventional selective vapor deposition method necessitates increasing a mask size as a substrate size increases.

However, an increase in mask size causes self-weight bending and extension of the mask. This is more likely to generate a gap, whose size varies depending on a position on the vapor-deposited surface of the substrate, between the substrate and the mask.

Use of the conventional selective vapor deposition method therefore makes it difficult to perform precise patterning, thereby causing problems such as misplacement of vapor deposition and color mixture.

Moreover, according to the conventional selective vapor deposition method, the increase in mask size leads to an increase in size and weight of members such as a frame holding the mask and the like. This makes handling of these members difficult, thereby threatening productivity and safety.

According to the conventional selective vapor deposition method, a vapor deposition device and accompanying devices also increase in size and become complicated. This makes device designing difficult and makes a device installation cost expensive.

As described above, according to the conventional selective vapor deposition method, it is difficult to form a deposition film patterned with high definition on a large-size substrate. For example, selective vapor deposition at a mass production level has not been established yet for a large-size substrate for which a 60-inch or larger mask is used.

CITATION LIST

Patent Literature 1

Japanese Patent Application Publication, Tokukaihei, No. 8-227276 A (Publication Date: Sep. 3, 1996)

Patent Literature 2

Japanese Patent Application Publication, Tokukai, No. 2000-188179 A (Publication Date: Jul. 4, 2000)

SUMMARY OF INVENTION

Technical Problem

In view of the circumstance, a selective vapor deposition method using a shadow mask 102 that is smaller in size than a substrate 101 is proposed (see FIG. 13 and FIG. 14).

This selective vapor deposition method uses a mask unit 105 in which a shadow mask 102 having openings 102a, a nozzle 103 having nozzle openings 103a (injection holes), and a vapor deposition material supply source 104 connected to the nozzle 103 are unified.

As illustrated in FIG. 13, a vapor-deposited surface 101a of the substrate 101 faces the shadow mask 102. Vapor deposition is carried out by scanning the substrate 101 with respect to the mask unit 105 (which is fixed) in the left-right direction of FIG. 13 while maintaining a gap G between the vapor-deposited surface 101a and the shadow mask 102. This forms a vapor-deposited film having a striped pattern on the vapor-deposited surface 101a of the substrate 101.

Alternatively, the selective vapor deposition method may be such that a vapor-deposited film having a striped pattern is formed on the vapor-deposited surface 101a of the substrate 101 by carrying out vapor deposition while scanning the mask unit 105 with respect to the substrate 101 (which is fixed) in the left-right direction of FIG. 14 (see FIG. 14).

Such a selective vapor deposition method with selective scanning does not necessitate using a mask that has a substantially same size as a substrate. This can remedy the aforementioned problems that can occur due to an increase in mask size.

However, the selective vapor deposition method with selective scanning using the shadow mask 102 that is smaller in size than the substrate 101 causes the following new problems.

FIG. 15 is a view illustrating the vapor-deposited surface 101a of the substrate 101. The substrate 101 is large in size, and has, for each organic EL display device, (i) a vapor deposition region R1 in which a vapor-deposited film (e.g., a luminescent layer) needs to be formed and (ii) a vapor deposition unnecessary region R2 in which a vapor-deposited film (e.g., a luminescent layer) does not need to be formed and which serves as a terminal section and the like.

Although it is originally unnecessary to form a vapor-deposited film (e.g., a luminescent layer) in the vapor deposition unnecessary region R2, the selective vapor deposition method with selective scanning illustrated in FIG. 13 and FIG. 14 forms a vapor-deposited film 106 having a striped pattern not only in the vapor deposition region R1 but also in the vapor deposition unnecessary region R2 (see FIG. 15).

With reference to FIG. 16, the following describes reasons why the vapor-deposited film 106 having a striped pattern is formed also in the vapor deposition unnecessary region R2.

As illustrated in FIG. 16, one possible method for preventing the vapor-deposited film 106 from being formed in the vapor deposition unnecessary region R2 in the selective vapor deposition method with selective scanning is to stop vapor deposition particles from being injected from the nozzle openings of the nozzle in the mask unit when the shadow mask 102 reaches a vapor deposition OFF line, more specifically, when a right end of the shadow mask 102 reaches a left end of the vapor deposition unnecessary region R2.

Although this method can prevent the vapor-deposited film 106 from being formed in the vapor deposition unnecessary region R2, a vapor deposition time is substantially shortened in a region of the vapor deposition region R1 in which region the shadow mask 102 still remains, thereby rendering such a region a vapor deposition amount reduced region in which a vapor-deposited film has a reduced thickness.

In order to form a vapor-deposited film 106 having a uniform thickness in the vapor deposition region R1, the selective vapor deposition method with selective scanning conventionally had no option but to form the vapor-deposited film 106 having a striped pattern not only in the vapor deposition region R1 but also in the vapor deposition unnecessary region R2 as illustrated in FIG. 15.

FIG. 17 is a view for explaining problems that can occur due to the vapor-deposited film 106 formed in the vapor deposition unnecessary region R2.

(a) of FIG. 17 illustrates an outline configuration of an organic EL display device 113 including, as a luminescent layer, a vapor-deposited film 106 formed by the selective vapor deposition method with selective scanning.

(b) of FIG. 17 is a plan view illustrating a terminal section 107a of a wire 107 in the organic EL display device 113.

The organic EL display device 113 illustrated in (a) of FIG. 17 includes a substrate 101 which has a vapor deposition region R1 and a vapor deposition unnecessary region R2 in both of which a vapor-deposited film 106 having a striped pattern is formed.

That is, the vapor-deposited film 106 is formed also on the terminal section 107a provided in the vapor deposition unnecessary region R2 as illustrated in (b) of FIG. 17.

An external circuit and the terminal section 107a provided in the vapor deposition unnecessary region R2 are electrically connected to a flexible cable 112 via an anisotropic conductive film (ACF) 111. However, the vapor-deposited film 106 formed on the terminal section 107a causes poor electrical conduction or electrical current leakage (see (a) of FIG. 17).

Specifically, in a case where the vapor-deposited film 106 is a high-resistance film such as an organic vapor-deposited film (e.g., a luminescent layer), poor electrical conduction occurs, whereas in a case where the vapor-deposited film 106 is a low-resistance film such as a metal film, electrical current leakage occurs.

Further, a sealing resin 109 is formed in a frame shape in the vapor deposition unnecessary region R2 so as to surround four sides of the vapor deposition region R1, and the substrate 101 is combined with a sealing substrate 110 via the sealing resin 109.

This can prevent moisture and oxygen in atmosphere from deteriorating an organic EL element including an anode (not illustrated), a hole injection layer/hole transfer layer (not illustrated), the vapor-deposited film 106 (luminescent layer), an electron transfer layer (not illustrated), an electron injection layer (not illustrated), and a cathode 108 that are stacked in this order.

Although it may be possible to wipe away the vapor-deposited film 106 formed on the terminal section 107a in the vapor deposition unnecessary region R2 with the use of an organic solvent before the substrate 101 and the sealing substrate 110 are combined with each other, the organic solvent and moisture and oxygen in the atmosphere deteriorate the organic EL element. On this account, the vapor-deposited film 106 formed on the terminal section 107a is generally wiped away with the use of an organic solvent after (i) the substrate 101 and the sealing substrate 110 are combined with each other and (ii) the substrate 101 is divided into organic EL display devices 113.

However, in a case where the vapor-deposited film 106 formed on the terminal section 107a is wiped away with the use of an organic solvent after the substrate 101 and the sealing substrate 110 are combined with each other, the following problems arise.

One problem is that insufficient wiping in the wiping step leaves a residue and the wiping is likely to introduce a new foreign substance, resulting in that a connection failure with an external circuit is likely to occur.

Another problem is that in a case where the substrate 101 and the sealing substrate 110 are combined with each other via the sealing resin 109, the organic solvent damages the sealing resin 109, and portions of the sealing resin 109 that have been damaged by the organic solvent are more vulnerable to infiltration of moisture and oxygen in the atmosphere.

Therefore, for example, an organic EL display device produced by a production method including such a wiping step is low in yield and difficult to secure reliability.

The present invention was attained in view of the above problems, and an object of the present invention is to provide (i) a method for forming a vapor-deposited film that can be patterned with high definition and (ii) a method for producing a display device that achieves improved yield and reliability.

Solution to Problem

In order to attain the above object, a method of the present invention for forming, on a substrate, vapor-deposited films each having a predetermined shape, includes the steps of: (a) forming, on a surface of the substrate on which surface the vapor-deposited film are to be formed, a pattern film of a predetermined shape which has an opening and which can be peeled off; (b) forming, on the opening and the pattern film, the vapor-deposited films, having a linear shape, that extend in a direction on the substrate and that are provided at certain intervals; and (c) peeling the pattern film off from the substrate so that the vapor-deposited films are formed in the predetermined shape.

According to the method, a pattern film of a predetermined shape that has an opening and that can be peeled off is formed on a surface of the substrate on which surface the vapor-deposited films are to be formed. Then, the vapor-deposited films, having a linear shape, which is a pattern shape that can be relatively easily formed with high definition, are formed on the opening and the pattern film at certain intervals. Subsequently, the pattern film is peeled off. As a result, the vapor-deposited films each having the linear shape can be formed in a predetermined shape as a high-definition pattern.

According to the method, it is therefore possible to achieve high-definition patterning.

In order to attain the above object, a method of the present invention for producing a display device includes the steps of: (a) forming a plurality of active elements on a substrate; (b) forming first electrodes in a matrix manner in a display region of the substrate, the first electrodes being electrically connected to the respective plurality of active elements; (c) forming, on the first electrodes, respective organic layers each including luminescent layers; and (d) forming, at least on the organic layer, a second electrode that has a polarity opposite to those of the first electrodes, the step (c) including the steps of: (e) forming, in the display region, an opening of a pattern film that can be peeled off and forming the pattern film in at least part of a non-display region which is on the periphery of the display region; and (f) forming, on the opening and the pattern film, the at least luminescent layers, each having a linear shape, that are formed at certain intervals and extend in a row direction of or in a column direction of the first electrodes formed in the matrix, after the formation of the at least luminescent layers in the step (c) or after the step (d), the at least luminescent layers being formed in a predetermined shape by peeling the pattern film off.

According to the method, it is possible to achieve a method for producing a display device that is improved in yield and reliability.

Advantageous Effects of Invention

As described above, the method of the present invention for forming, on a substrate, vapor-deposited films each having a predetermined shape includes the steps of: (a) forming, on a surface of the substrate on which surface the vapor-deposited film are to be formed, a pattern film of a predetermined shape which has an opening and which can be peeled off; (b) forming, on the opening and the pattern film, the vapor-deposited films, having a linear shape, that extend in a direction on the substrate and that are provided at certain intervals; and (c) peeling the pattern film off from the substrate so that the vapor-deposited films are formed in the predetermined shape.

As described above, the method of the present invention for producing a display device includes the steps of: (a) forming a plurality of active elements on a substrate; (b) forming first electrodes in a matrix manner in a display region of the substrate, the first electrodes being electrically connected to the respective plurality of active elements; (c) forming, on the first electrodes, respective organic layers each including luminescent layers; and (d) forming, at least on the organic layer, a second electrode that has a polarity opposite to those of the first electrodes, the step (c) including the steps of: (e) forming, in the display region, an opening of a pattern film that can be peeled off and forming the pattern film in at least part of a non-display region which is on the periphery of the display region; and (f) forming, on the opening and the pattern film, the at least luminescent layers, each having a linear shape, that are formed at certain intervals and extend in a row direction of or in a column direction of the first electrodes formed in the matrix, after the formation of the at least luminescent layers in the step (c) or after the step (d), the at least luminescent layers being formed in a predetermined shape by peeling the pattern film off.

It is therefore possible to achieve a method for forming a vapor-deposited film that can be patterned with high definition and to achieve a method for producing a display device that is improved in yield and reliability.

BRIEF DESCRIPTION OF DRAWINGS

FIG. 3 is a flow chart showing steps of the method for producing an organic EL display device in accordance with the embodiment of the present invention.

FIG. 7 is a view illustrating the substrate obtained by the step of peeling off the photoresist and the step of sealing a sealing region in the method for producing an organic EL display device in accordance with the another embodiment of the present invention.

DESCRIPTION OF EMBODIMENTS

Embodiments of the present invention will be described below in detail with reference to the drawings. Note, however, that the dimensions, materials, shapes, relative locations, and the like of respective constituent elements described in Embodiments are illustrative only, and that the scope of the present invention should not be narrowly construed based on them.

Note that each of the following Embodiments will deal with a method for producing an organic EL display device as an example in which a method for forming a vapor-deposited film that can be patterned with high definition is employed. Embodiments are, however, not limited to this. The method of the present invention for forming a vapor-deposited film is applicable to any kind of technical fields in which a vapor-deposited film patterned with high definition is demanded.

Note also that the following Embodiments will deal with a case where a vapor-deposited film, formed by the method of the present invention, is an organic film because the following embodiments discuss a method for producing an organic EL display device as an example. Embodiments are, however, not limited to this. Needless to say, the method of the present invention for forming a vapor-deposited film can be applied also to formation of an inorganic film.

[Embodiment 1]

Figure 12:
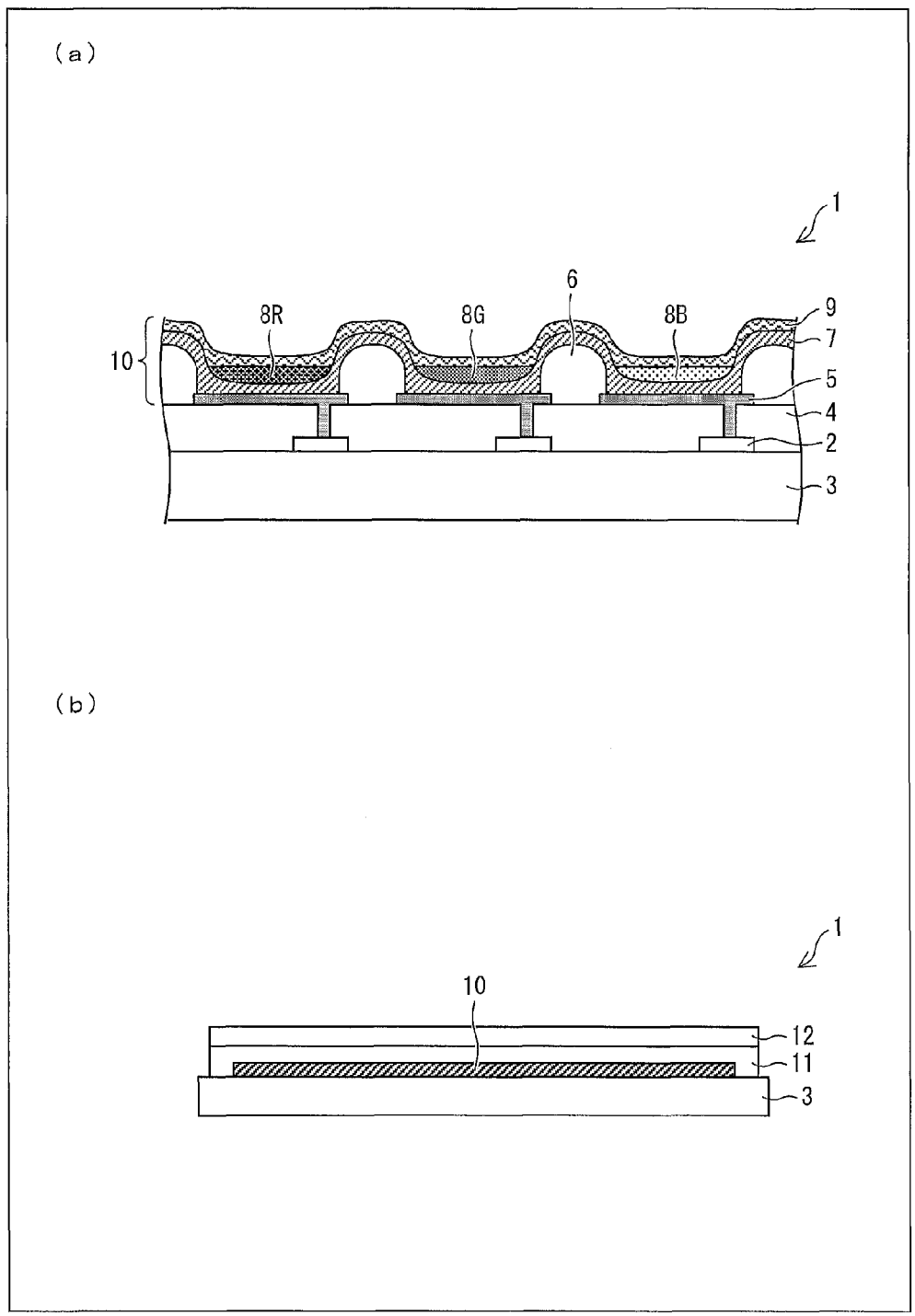
FIG. 12 is a view schematically illustrating a configuration of an organic EL display device produced by the method for producing an organic EL display device in accordance with the embodiment of the present invention.

FIG. 12 is a view schematically illustrating a configuration of an organic EL display device 1. (a) of FIG. 12 is a cross-sectional view of organic EL elements 10 that constitute a display region of the organic EL display device 1.

There are provided, on a substrate 3 where thin film transistors (hereinafter referred to as "TFTs") 2 are provided, an interlayer insulating film 4, first electrodes 5, and edge covers 6.

For example, alkali-free glass or plastic can be employed as the substrate 3. Embodiment 1 employs, as the substrate 3, an alkali-free glass substrate having a thickness of 0.7 mm.

A known photosensitive resin can be employed as each of the interlayer insulating film 4 and the edge covers 6. Examples of such a known photosensitive resin encompass an acrylic resin and a polyimide resin.

In Embodiment 1, a photosensitive acrylic resin is employed as each of the interlayer insulating film 4 and the edge covers 6.

The first electrodes 5 are formed by (i) depositing an electrode material by a method such as sputtering and (ii) then patterning the electrode material in shapes for respective pixels by photolithography and etching.

The first electrodes 5 can be made of any of various electrically conductive materials. Note, however, that the first electrodes 5 need to be transparent or semi-transparent in a case where the organic EL display device 1 is a bottom emission organic EL element in which light is emitted towards a substrate side. Meanwhile, a second electrode 9 needs to be transparent or semi-transparent in a case where the organic EL display device 1 is a top emission organic EL element in which light is emitted from a side opposite to the substrate side.

The TFTs 2 are prepared by a known method. Embodiment 1 will discuss how to produce an active matrix organic EL display device in which the TFTs 2 are provided for respective pixels. Note, however, that Embodiment 1 is not limited to this. Embodiment 1 is applicable also to a passive matrix organic EL display device in which no TFT 2 is provided.

The edge covers 6 cover edge parts of the first electrodes 5 so as to prevent the corresponding first electrodes 5 and the second electrode 9 from short-circuiting due to a reduction in thickness of an organic EL layer in the edge parts of the corresponding first electrodes 5. Each first electrode 5 is exposed in a corresponding area between adjacent edge covers 6. Note that such a corresponding area serves as a light-emitting section of a corresponding pixel.

As illustrated in (a) of FIG. 12, each organic EL layer is formed on a corresponding first electrode 5. The organic EL layer is made up of, for example, a hole injection layer/hole transfer layer 7, luminescent layers 8R, 8G, and 8B, and an electron transfer layer/an electron injection layer (not illustrated). The electron transfer layer/electron injection layer is formed in shapes identical to the second electrode 9.

The organic EL layer can, as needed, further include a carrier blocking layer (not illustrated) for blocking a flow of carriers such as holes and electrons.

A single layer can have a plurality of functions. For example, the hole injection layer/hole transfer layer 7 serves as both a hole injection layer and a hole transfer layer.

In Embodiment 1, (a) the first electrode 5, serving as an anode, (b) the hole injection layer/hole transfer layer 7, (c) the luminescent layers 8R, 8G, and 8B, (d) the electron transfer layer (not illustrated), (e) the electron injection layer (not illustrated), and (f) the second electrode 9 serving as a cathode, are stacked in this order from a first electrode 5 side.

Note that, in a case where the first electrode 5 is intended to serve as a cathode, the order in which the layers are stacked is reversed.

Since Embodiment 1 employs a bottom emission organic EL element, ITO (indium tin oxide) is employed as the first electrode 5.

The organic EL layer can be made of a known material. For example, each of the luminescent layers 8R, 8G, and 8B is made of a single material or made of a host material mixed with another material as a guest material or a dopant.

Specific examples of materials of which the organic EL layer is made are presented below.

The hole injection layer/hole transfer layer 7 can be made of a material such as anthracene, azatriphenylene, fluorenone, hydrazone, stilbene, triphenylene, benzine, styryl amine, triphenylamine, porphyrin, triazole, imidazole, oxadiazole, oxazole, polyarylalkane, phenylenediamine, arylamine, or a derivative of any of the above, a monomer, an oligomer, or a polymer of a heterocyclic conjugated system, such as a thiophene compound, a polysilane compound, a vinylcarbazole compound, or an aniline compound.

The luminescent layers 8R, 8G, and 8B are each made of a material, such as a low-molecular fluorescent pigment or a metal complex, that has high light emission efficiency. For example, the luminescent layers 8R, 8G, and 8B are each made of a material such as anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, a derivative of any of the above, a tris(8-quinolinate) aluminum complex, a bis(benzoquinolinate) beryllium complex, a tri (dibenzoylmethyl) phenanthroline europium complex, ditoluyl vinyl biphenyl, hydroxyphenyl oxazole, or hydroxyphenyl thiazole.

The electron transfer layer and the electron injection layer are each made of a material such as a tris(8-quinolinate) aluminum complex, an oxadiazole derivative, a triazole derivative, a phenylquinoxaline derivative, or a silole derivative.

(b) of FIG. 12 illustrates a state in which the organic EL element 10 is sealed. The organic EL element 10 is made up of the first electrode 5, the hole injection layer/hole transfer layer 7, the luminescent layer 8R, 8G, and 8B, the electron transfer layer/electron injection layer, and the second electrode 9.

As illustrated in (b) of FIG. 12, a sealing resin 11 is formed in a frame shape along four sides of a display region of the organic EL display device 1 so that the organic EL elements 10 do not deteriorate due to moisture and oxygen contained in the atmosphere. The substrate 3 is combined with a sealing substrate 12, via a sealing resin 11.

In Embodiment 1, a glass substrate is employed as the sealing substrate 12, and the organic EL elements 10 are sealed by combining the substrate 3 with the sealing substrate 12 via the sealing resin 11 which is adhesive and which is formed in a frame shape. Note, however, that a method of sealing the organic EL elements 10 is not limited to this. For example, the organic EL elements 10 can be sealed also by a first method of (i) depositing, on top surfaces of the organic EL elements 10, a dense sealing film which is difficult for moisture and oxygen to pass through by use of a method such as a CVD method, (ii) applying an adhesive to entire side surfaces of the organic EL elements 10, and then (iii) combining the substrate 3 with a sealing substrate. Alternatively, the organic EL elements 10 can be sealed also by a second method of forming fritted glass (powder glass) in a frame shape.

Alternatively, the organic EL elements 10 can be, as needed, sealed by the first and second methods in combination.

FIG. 3 is a flow chart schematically showing steps of a process for producing the organic EL display device 1.

First, the substrate 3, having TFTs and first electrodes electrically connected to the respective TFTs, is prepared by a known method (S1).

Then, a photoresist 13 is formed so as to cover vapor deposition unnecessary regions R2, on the substrate 3, in which a terminal section and the like are formed (S2).

Figure 1:
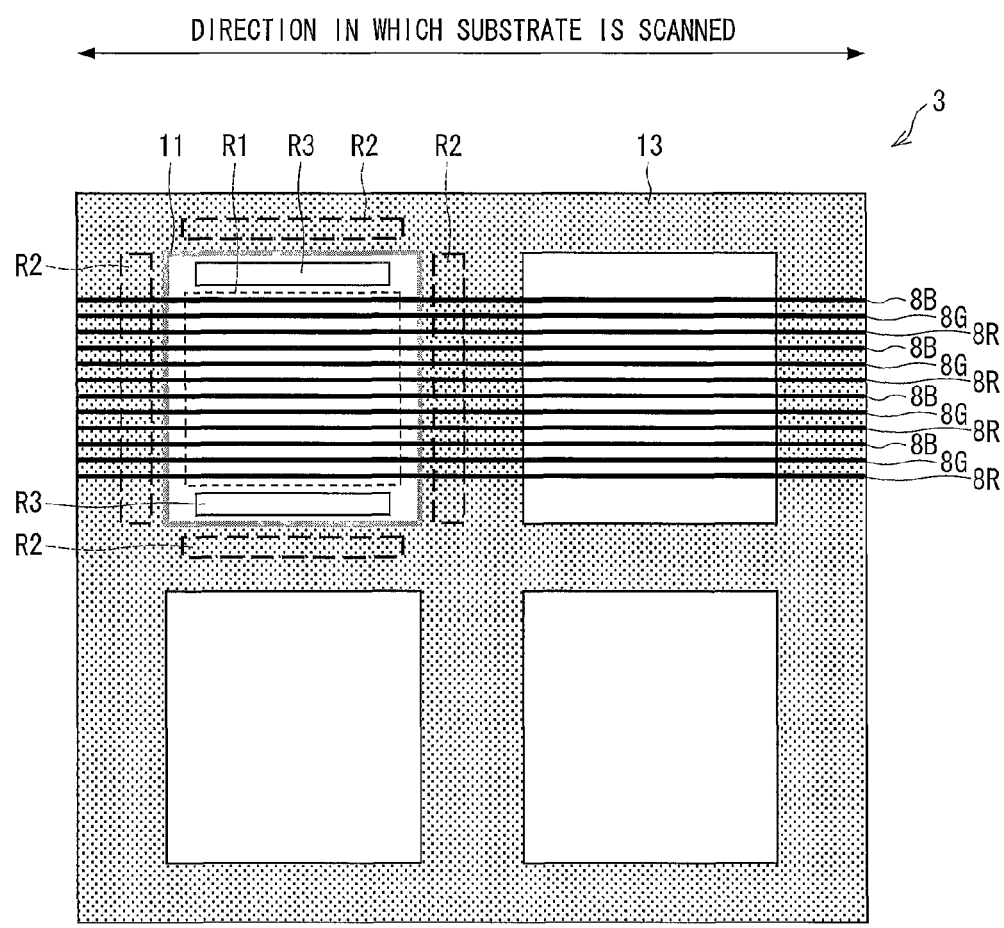
FIG. 1 is a view illustrating a state where a photoresist is formed so as to be patterned on a substrate in a method for producing an organic EL display device in accordance with an embodiment of the present invention.

FIG. 1 is a view illustrating a state in which the photoresist 13 is formed so as to be patterned on the substrate 3.

As illustrated in FIG. 1, the photoresist 13 is not formed within the sealing resin 11 which is formed in a frame shape, but is formed only in an outside of the sealing resin 11.

That is, the photoresist 13 is formed only outside a sealing region of each organic EL panel, but no photoresist 13 is formed within a display region R1 (luminescent region) and the sealing region.

According to Embodiment 1, a positive-type photoresist 13 is employed as a pattern film that can be peeled off in a post-process. The photoresist 13 is patterned in the shape illustrated in FIG. 1 through a coating step, a pre-baking step, an exposure step, a developing step, and a post-baking step.

General-purpose photoresist can be employed as the photoresist 13. Note, however, that it is preferable to employ one that has (i) a small amount of water absorption and (ii) small degasification in a vacuum.

In a case where the photoresist 13 has a large amount of water absorption, moisture detached from the photoresist 13 may damage a film constituting an organic EL element during a process for preparing the organic EL element.

Similarly, in a case where the photoresist 13 has large degasification, gas detached from the photoresist 13 may damage a film constituting an organic EL element during a process for preparing the organic EL element.

It is therefore preferable that the photoresist 13 be made of a low-water-absorbent material or a heat-resisting material that does not produce moisture and resolvent in the post-process.

Examples of the heat-resistance material encompass an organic-inorganic hybrid material, but Embodiment 1 is not limited to this.

In a process of preparing an organic EL element, a surface of the first electrode is generally subjected to plasma treatment or UV treatment before forming an organic layer including a luminescent layer, for the purpose of washing the surface of the first electrode.

It is therefore preferable to employ a photoresist 13 that has a high resistance to the above treatments so that resolvent, which is generated due to deterioration in the photoresist 13 during the above treatments, does not adversely affect the organic EL element.

Next, a shadow mask that has an opening of a predetermined shape is tightly fixed onto the photoresist 13 provided on the substrate 3, and then a hole injection layer/hole transfer layer is formed all over the substrate 3 by use of a conventional vacuum vapor deposition method (S3).

Although, in Embodiment 1, the hole injection layer/hole transfer layer is formed with the use of the shadow mask, a hole injection layer/hole transfer layer can also be formed with the use of the shadow mask in combination of the photoresist 13.

In FIG. 1, a second electrode connection section R3 is located within an opening of the photoresist 13. Accordingly, in a case where the photoresist 13 is used alone as a mask to form a hole injection layer/hole transfer layer, the hole injection layer/hole transfer layer is formed also on the second electrode connection section R3. This causes a connection failure to occur between the second electrode connection section R3 and the second electrode because there exists an organic film between the second electrode connection section R3 and the second electrode.

In view of the circumstances, (i) the shadow mask is employed to cover the second electrode connection section R3 and (ii) the photoresist 13 is employed to cover the other portions. This allows a hole injection layer/hole transfer layer to be formed in a predetermined shape.

Note that the hole injection layer/hole transfer layer can be formed by carrying out vapor deposition collectively all over the organic EL elements. This does not require precise patterning. It is therefore possible to employ an open mask that has an opening corresponding to the display region R1. The open mask can be applied also to vapor deposition on a large-size substrate because a frame for holding the open mask need not be so large and is low in weight.

Next, as illustrated in FIG. 1, the luminescent layers 8R, 8G, and 8B, having a striped pattern extending in the left-right direction of FIG. 1, are formed by carrying out vapor deposition with respect to the mask unit 105 while scanning the substrate 101 in the left-right direction of FIG. 1 (S4). In the mask unit 105, (i) the shadow mask 102 that has openings 102a and that is smaller in size than the substrate 101, (ii) the nozzle 103 having nozzle openings (injection holes) 103a, and (iii) the vapor deposition material supply source 104 connected to the nozzle 103 are integrated with each other (see FIG. 13).

Figure 14:
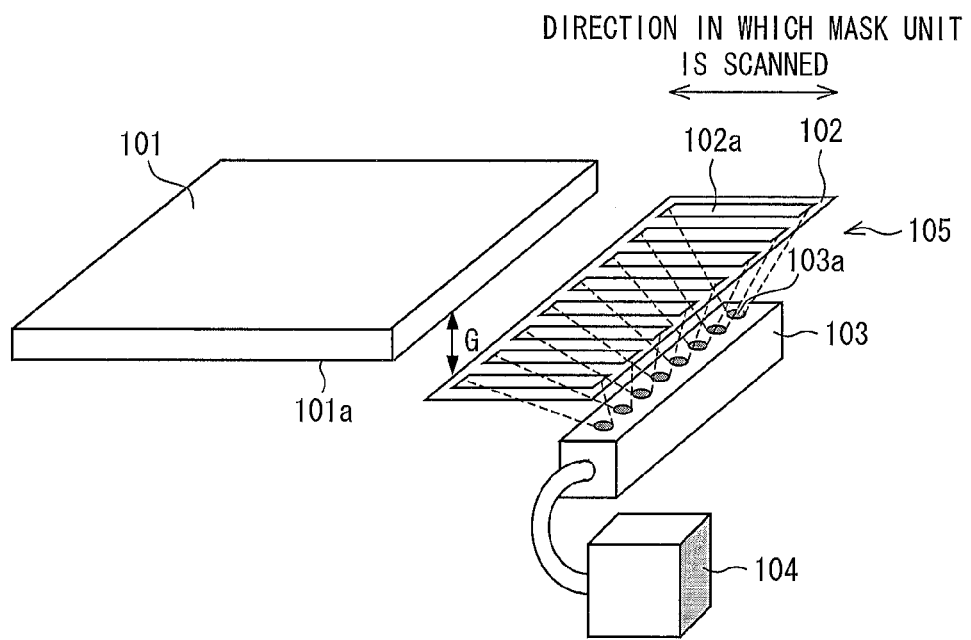
FIG. 14 is a view illustrating an example of a vapor deposition device that can be employed in the method for producing an organic EL display device in accordance with the embodiment of the present invention.
Figure 15:
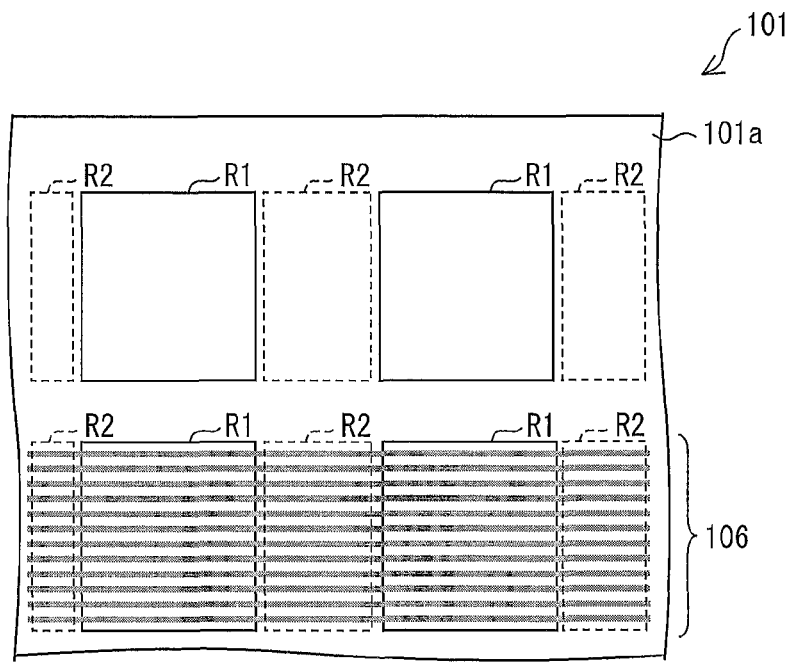
FIG. 15 is a view illustrating vapor-deposited films formed on a substrate by use of the vapor deposition device illustrated in FIG. 13 or FIG. 14.
Figure 16:
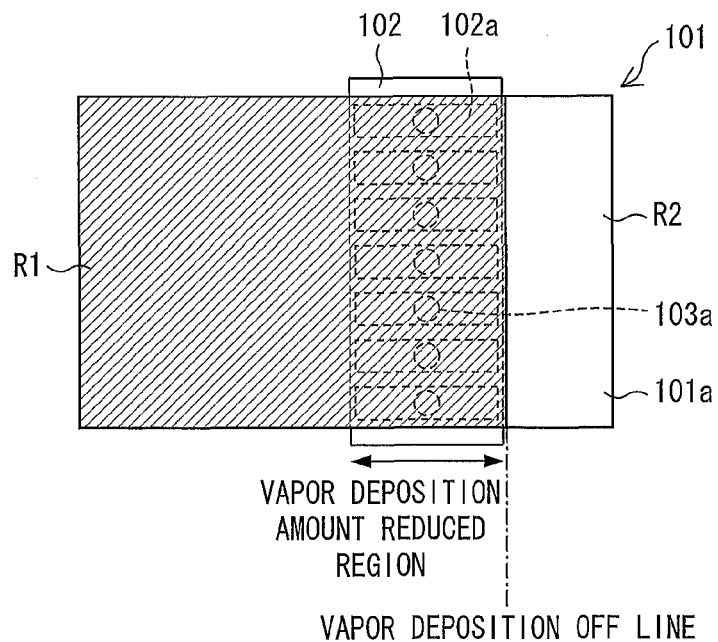
FIG. 16 is a view for explaining a reason why vapor-deposited films having a striped pattern are formed also in a vapor deposition unnecessary region.
Figure 17:
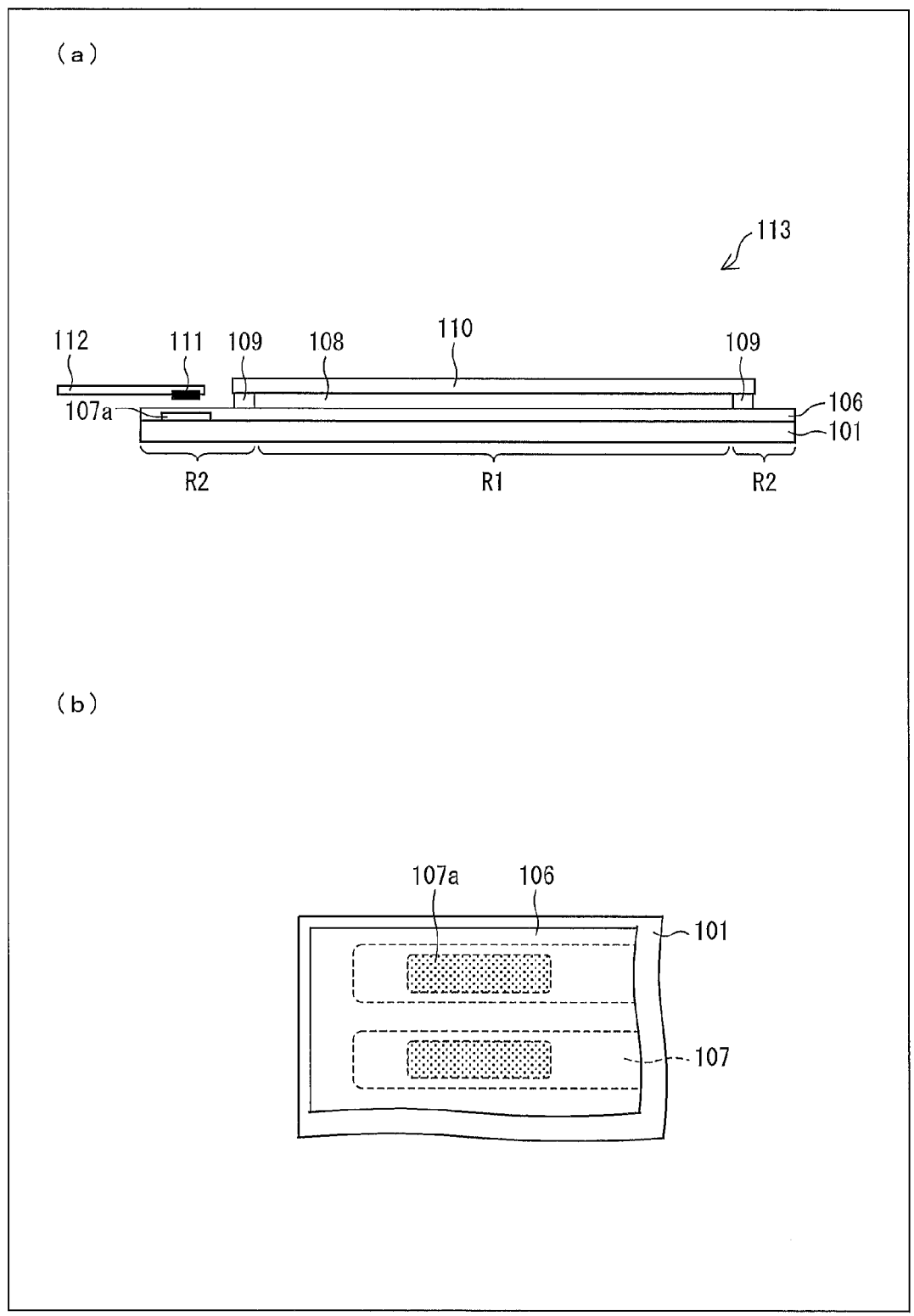
FIG. 17 is a view for explaining problems that can arise due to the vapor-deposited films formed in the vapor deposition unnecessary region.

Embodiment 1 deals with a case where the substrate 101 is scanned with respect to the mask unit 105, but is not limited to this. Alternatively, the mask unit 105 can be scanned with respect to the substrate 101 as illustrated in FIG. 14. Alternatively, the substrate 101 and the mask unit 105 can be scanned in respective opposite directions.

In Embodiment 1, the shadow masks 102 for colors R, G, and B whose openings are formed so as to face respective R, G, and B sub-pixels. Each shadow mask 102 has a length, in the longitudinal direction, which is set to be equal to that of the display region R1 in an up-down direction of FIG. 1. In a case where the luminescent layers 8R, 8G, and 8B are formed in the upper display regions R1 of FIG. 1, the substrate 3 is scanned with respect to the mask unit 105 in a rightward direction of FIG. 1. In a case where the luminescent layers 8R, 8G, and 8B are formed in the lower display regions R1 of FIG. 1, the substrate 3 is moved with respect to the mask unit 105 in an upward direction of FIG. 1 and is then scanned in a leftward direction of FIG. 1 after being subjected to alignment.

Note that the shape of the shadow mask 102 is not limited to the one described above, and can therefore be appropriately modified to such a degree that no self-weight bending and extension of the shadow mask 102 occurs. Note also that it is also possible to carry out vapor deposition collectively with respect to the upper and lower display regions R1 of FIG. 1.

Luminous layers 8R are formed on respective R sub-pixels, by carrying out vapor deposition with respect to the shadow mask 102 that merely has openings which face the R sub-pixels, while causing the vapor deposition material supply source 104 to inject R (red) vapor deposition particles towards the substrate 101 through the shadow mask 102.

Similarly, luminescent layers 8G are formed on respective G sub-pixels, and luminescent layers 8B are formed on respective B sub-pixels.

That is, in Embodiment 1, the luminescent layers 8R, 8G, and 8B are formed by a selective vapor deposition method with selective scanning.

Accordingly, the luminescent layers 8R, 8G, and 8B having a striped pattern are formed on the hole injection layer/hole transfer layer in the display region R1 (luminescent region) and the sealing region in each of which no photoresist 13 is formed, whereas the luminescent layers 8R, 8G, and 8B having a striped pattern are formed on the hole injection layer/hole transfer layer provided on the photoresist 13 within the vapor deposition unnecessary region R2 in which the photoresist 13 is formed (see FIG. 1).

Figure 13:
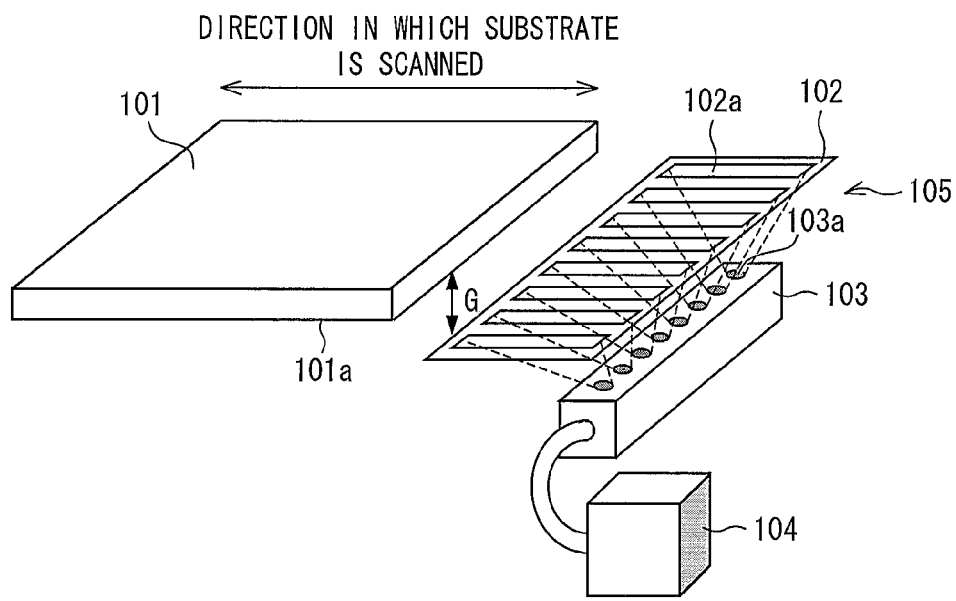
FIG. 13 is a view illustrating an example of a vapor deposition device that can be employed in the method for producing an organic EL display device in accordance with embodiment of the present invention.

In Embodiment 1, vapor deposition is carried out while scanning the substrate 101 with respect to the mask unit 105 as illustrated in FIG. 13. Note, however, that vapor deposition can be carried out while scanning the mask unit 105 with respect to the substrate 101 as illustrated in FIG. 14.

In Embodiment 1, the luminescent layers 8R, 8G, and 8B, having a striped pattern, are formed on a vapor-deposited surface 101a of the substrate 101 by carrying out vapor deposition with respect to the vapor-deposited surface 101a while securing a predetermined gap G between the vapor-deposited surface 101a and the shadow mask 102 (see FIG. 13). Alternatively, the luminescent layers 8R, 8G, and 8B, having a striped pattern, can also be formed by carrying out vapor deposition while the vapor-deposited surface 101a of the substrate 101 and the shadow mask 102 are closely contacted.

In Embodiment 1, the vapor deposition device illustrated in FIG. 13 is employed to form the luminescent layers 8R, 8G, and 8B having a striped pattern. Note, however, that the type of the vapor deposition device is not limited to a specific one, provided that it can form a fine striped pattern having a uniform film thickness.

Then, a shadow mask, which has openings of a predetermined shape and which is fixed to and is closely contacted with the photoresist 13, is formed on the substrate 3, and then an electron transfer layer and an electron injection layer are sequentially formed all over the substrate 3 by use of a conventional vacuum vapor deposition method (S5, S6).

Subsequently, the second electrode is sequentially formed all over the substrate 3, by use of a conventional vacuum vapor deposition method in which the photoresist 13 formed on the substrate 3 functions as a mask (S7).

Then, the second electrode, which is formed all over (i) the sealing region including the display region R1 and (ii) a region where the photoresist 13 is formed, is electrically connected to wiring provided on the substrate 3, via the second electrode connection sections R3 formed in upper end and lower end parts of the display region R1 (see FIG. 1).

In Embodiment 1, the shadow mask is employed to form the electron transfer layer and the electron injection layer. Alternatively, the photoresist 13 can also be used as a mask in combination with the shadow mask, as in the case of formation of the hole injection layer/hole transfer layer.

Next, the sealing region, including the display region R1, on the substrate 3 that has been subjected to vapor deposition is sealed so that the organic EL element, including (a) the first electrode, (b) the hole injection layer/hole transfer layer, (c) the luminescent layers 8R, 8G, and 8B, (d) the electron transfer layer, (e) the electron injection layer, and (f) the second electrode, does not deteriorate due to moisture and oxygen in the atmosphere (S8).

As illustrated in FIG. 1, the sealing resin 11 is formed in a frame shape so as to surround four sides of the sealing region including the display region R1, and the substrate 3 is combined with a sealing substrate (not illustrated) via the sealing resin 11.

Then, the photoresist 13 is peeled off (S9). This allows layers (i.e., the hole injection layer/hole transfer layer, the luminescent layers 8R, 8G, and 8B, the electron transfer layer, the electron injection layer, and the second electrode) stacked on the photoresist 13 to be peeled off together with the photoresist 13.

Note that the photoresist 13 can be peeled off by use of an existing technique. Examples of the photoresist 13 encompass a photoresist 13 which is peeled off by a water-based exfoliative solution. Such a photoresist 13 can be peeled off from the substrate 3 by washing the substrate 3 with the use of the exfoliative solution.

Figure 2:
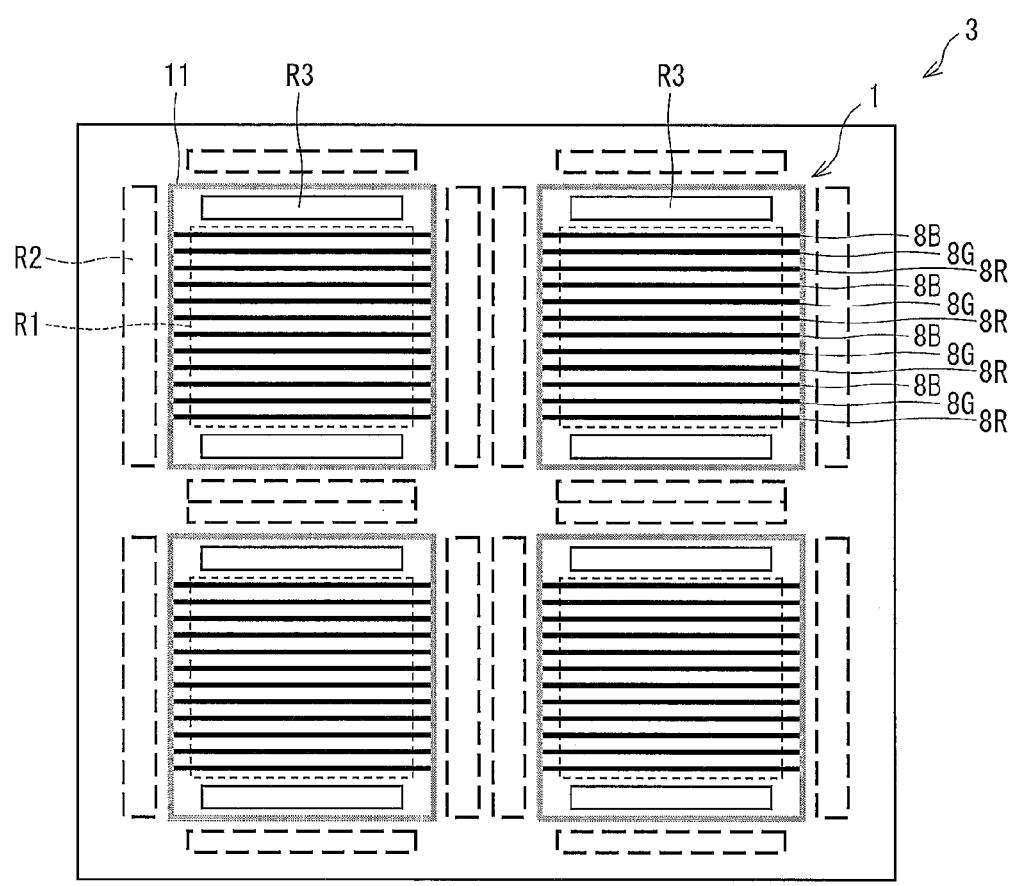
FIG. 2 is a view illustrating the substrate from which the photoresist has been peeled off in the method for producing an organic EL display device in accordance with the embodiment of the present invention.

FIG. 2 is a view illustrating the substrate 3 from which the photoresist 13 has been peeled off.

As illustrated in FIG. 2, none of (a) the hole injection layer/hole transfer layer, (b) the luminescent layers 8R, 8G, and 8B, (c) the electron transfer layer, (d) the electron injection layer, and (e) the second electrode is stacked in the vapor deposition unnecessary region R2, whereas the layers (a) through (e) are stacked only in the sealing region including the display region R1 in which the first electrode is formed.

Then, the substrate 3 is divided into organic EL panels (S10), and then each of the organic EL panels is connected to an external circuit (driving circuit) via a terminal section formed in the vapor deposition unnecessary region R2 (S11). The organic EL display device 1 is thus completed.

The organic EL display device 1 is prepared through the steps, and can carry out desired display by causing an external driving circuit to supply an electric current to organic EL elements provided for respective sub-pixels so that the organic EL elements emits light.

The following description will discuss in detail advantages that can be brought about by the photoresist 13 which is a pattern film that can be peeled off in a post-process, as compared with a process for producing an organic EL display device by use of a conventional selective vapor deposition method with selective scanning that method does not employ a pattern film that can be peeled off in a post-process.

Figure 4:
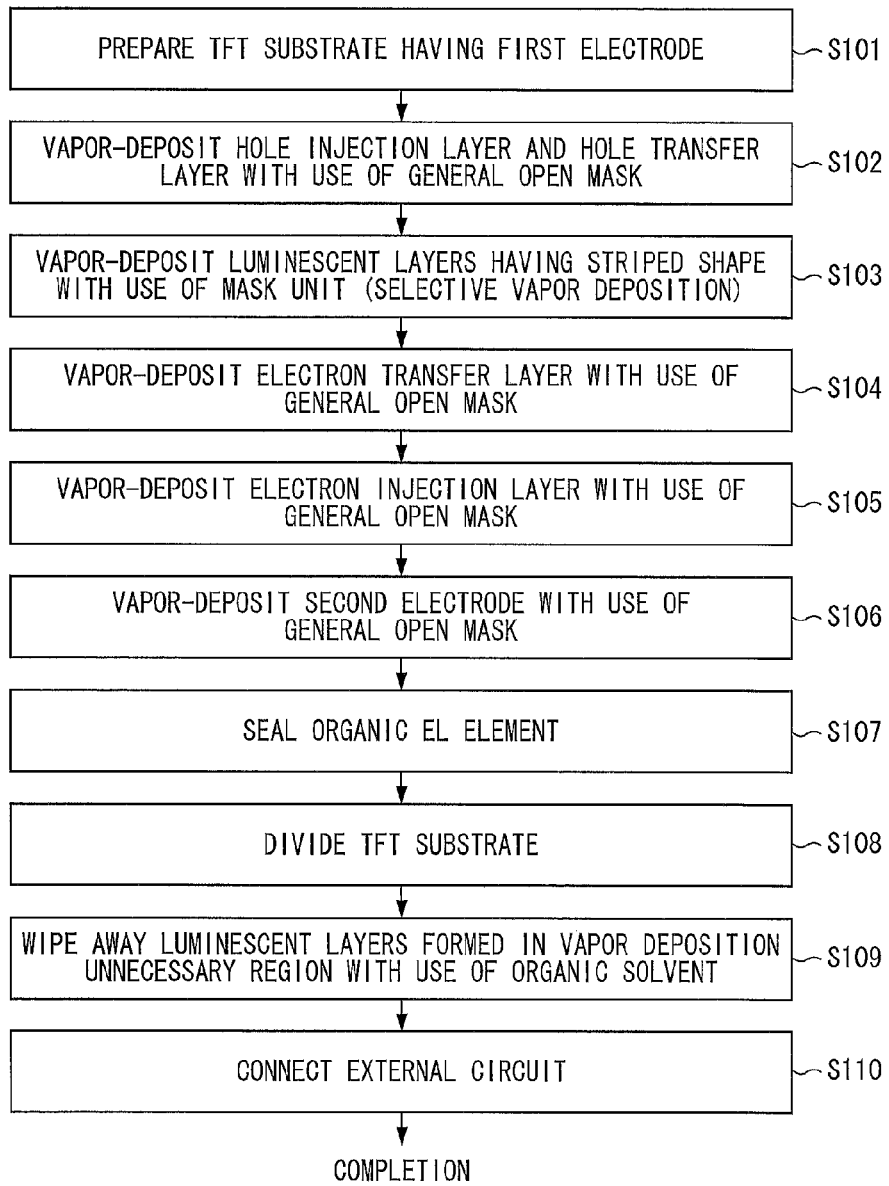
FIG. 4 is a flow chart schematically showing steps of a process for producing an organic EL display device by a conventional selective vapor deposition method with selective scanning.

FIG. 4 is a flowchart schematically showing steps of a process for producing an organic EL display device by use of a conventional selective vapor deposition method with selective scanning that method does not employ a pattern film that can be peeled off in a post-process.

As shown in FIG. 4, a substrate having, TFTs and first electrodes electrically connected to the TFTs, is first prepared by a known method (S101).

Since the photoresist 13 is not formed, a hole injection layer/hole transfer layer is formed, with the use of only a general open mask, all over the substrate based on a vacuum vapor deposition method (S102).

Since the photoresist 13 is not formed in the process shown in FIG. 4 for producing an organic EL display device by use of the conventional selective vapor deposition method with selective scanning, the photoresist 13 cannot be used as a mask together with the open mask, and therefore vapor deposition need be carried out with the use of only the general open mask.

That is to say, the process of the present invention for producing the organic EL display device 1 allows for simplification of a vapor deposition mask (the open mask). This allows (i) a reduction in attachment time of the vapor deposition mask (the open mask), which leads to an improvement in device tact time (an improvement in productivity) and (ii) a reduction in facility cost. Consequently, it is possible to achieve a reduction in production cost of an organic EL display device.

Moreover, according to the process (see FIG. 3) of the present invention for producing the organic EL display device 1, in which the photoresist 13 also can be used as a mask, a contact area is reduced between the open mask and the substrate 3. This allows (i) a reduction in damage, caused by the contact of the open mask, on the pattern formed on the substrate and (ii) a direct contact to be avoided between the open mask and the terminal section because the photoresist 13 covers the vapor deposition unnecessary region R2 in which the terminal section is formed, i.e., because the photoresist 13 serves also as a protective film for the terminal section. This allows the open mask to be prevented from damaging the terminal section, and ultimately allows an improvement in yield of the organic EL display device.

Since the photoresist 13 covers the vapor deposition unnecessary region R2 in which the terminal section is formed, a foreign substance is prevented from attaching to the terminal section and/or the like. This allows an improvement in reliability of the organic EL display device.

Next, luminescent layers having a striped pattern are formed with the use of the vapor deposition device illustrated in FIG. 13 in a manner similar to the process of the present invention for producing the organic EL display device 1 (S103).

However, according to the conventional process (see FIG. 4), no photoresist 13 covering the vapor deposition unnecessary region R2 is provided. This causes the luminescent layers, having the striped pattern, to be subjected to vapor deposition also in the vapor deposition unnecessary region R2. As a result, the luminescent layers are deposited directly on the terminal section.

It is therefore necessary to provide an additional step (S109) of wiping away the luminescent layers formed in the vapor deposition unnecessary region R2 with the use of an organic solvent. This causes a decline in productivity and yield of the organic EL display device. Details will be described later.

Then, since no photoresist 13 is provided, an electron transfer layer, an electron injection layer, and a second electrode are sequentially formed, with the use of only a general open mask, all over the substrate based on the conventional vacuum vapor deposition method (S104, S105, S106).

Since the photoresist 13 is not provided and cannot be used as a mask in the step for forming the electron transfer layer and the electron injection layer, there arises a similar problem to that mentioned for the step (S102) for forming the hole injection layer and the hole transfer layer all over the substrate based on the vacuum vapor deposition method.

Further, since the photoresist 13 cannot be used as a mask, the general open mask need be used in the step for forming the second electrode. This causes a similar problem to that in the case of formation of the electron transfer layer and the electron injection layer. In addition, there arises a need for a facility necessitated during use of the open mask.

Next, a step (S107) for sealing organic EL elements and a step (S108) for dividing the substrate into organic EL panels are carried out as in the process (see FIG. 3) of the present invention for producing the organic EL display device 1.

Then, the step (S109) of wiping away the luminescent layers formed in the vapor deposition unnecessary region R2 with the use of an organic solvent is carried out.

In the process (see FIG. 3) of the present invention for producing the organic EL display device 1, no step of wiping away the luminescent layers is necessary. This is because the photoresist 13 can be easily removed by being peeled off. On the other hand, in the conventional process (see FIG. 4), the step of wiping away the luminescent layers is essential, and it is therefore likely that the following problems is caused.

First, in the step of wiping away the luminescent layers, deposited luminescent layers need to be wiped away directly from the vapor deposition unnecessary region R2 with the use of an organic solvent. It is, however, difficult to completely remove the deposited luminescent layers. This results in a problem that a residue is likely to remain.

Second, the step of wiping away the luminescent layers is likely to cause a new foreign substance to be adhered onto the vapor deposition unnecessary region R2 in which the terminal section and the like are provided. In a case where (i) such a new foreign substance is adhered onto the vapor deposition unnecessary region R2 and (ii) the terminal section is connected to an external circuit, an electrical failure will occur during a connection between the terminal section and an external circuit. This causes a decline in yield of the organic EL display device.

Third, in a case where the substrate is combined with a sealing substrate with the use of a sealing resin or the like, the organic solvent will damage the sealing resin. This causes an undesirable decrease in reliability of the organic EL display device.

The photoresist 13 is used in the process (see FIG. 3) of the present invention for producing the organic EL display device 1. It is therefore possible to avoid the aforementioned problems that can arise in the case where no such photoresist 13 is provided. This is because it is possible to (i) remove the photoresist by use of an existing photoresist peeling technique without causing any residue, (ii) remove an adhered foreign substance with the use of an exfoliative solution, and (iii) suppress damage on a sealing resin because of a freedom of choice in the photoresist and the exfoliative solution to be employed.

Next, each of the organic EL panels is connected to an external circuit (driving circuit) via the terminal section from which the luminescent layers have been wiped away (S110). An organic EL display device is thus completed.

Figure 5:
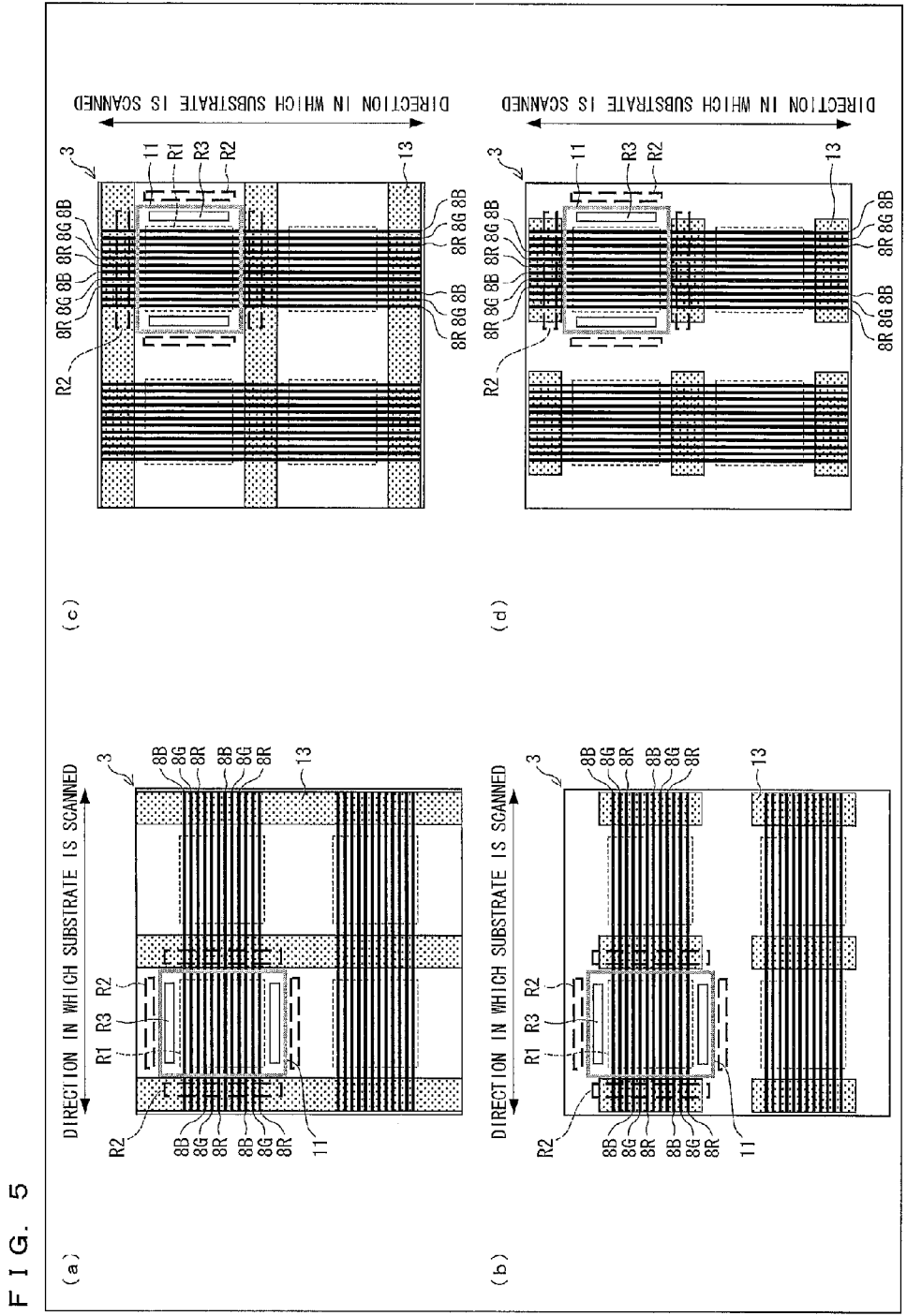
FIG. 5 is a view illustrating examples of a pattern shape of a photoresist that can be employed in the method for producing an organic EL display device in accordance with the embodiment of the present invention.

With reference to (a) through (d) of FIG. 5, the following description will discuss other examples of the pattern of the photoresist 13 that can be employed in the process of the present invention for producing the organic EL display device 1.

(a) and (b) of FIG. 5 are views each illustrating an example in which (i) three sub-pixels are provided so as to be adjacent to each other in the up-down direction of (a) and (b) of FIG. 5 each of which three sub-pixels has a corresponding organic EL element that has a corresponding one of red (R), green (G), and blue (B) luminescent layers, (ii) one (1) pixel of an organic EL display device is made up of the three sub-pixels, and (iii) the photoresist 13 is formed in at least a vapor deposition unnecessary region R2 where the luminescent layers 8R, 8G, and 8B are formed.

As illustrated in (a) and (b) of FIG. 5, it is not necessarily to cover, with the photoresist 13, vapor deposition unnecessary regions R2 where none of luminescent layers 8R, 8G, and 8B having a striped pattern is formed. Accordingly, as illustrated in (a) of FIG. 5, the photoresist 13 can be formed in a stripe shape so as to extend in the up-down direction of (a) of FIG. 5. Alternatively, as illustrated in (b) of FIG. 5, the photoresist 13 can be formed in an island shape.

In a case where there exist vapor deposition unnecessary regions R2 which are not covered by the photoresist 13 as illustrated in (a) and (b) of FIG. 5, a smaller effect is brought about, as compared with the case where the photoresist 13 is formed in the pattern illustrated in FIG. 1. For example, in the cases of (a) and (b) of FIG. 5, the photoresist 13 cannot be used as a mask for vapor deposition of organic films other than the luminescent layers 8R, 8G, and 8B. Nevertheless, the luminescent layers 8R, 8G, and 8B, having a striped pattern, can be patterned with high definition.

Note that, in a case where the photoresist 13 is patterned and formed as illustrated in (a) or (b) of FIG. 5, it is possible to reduce a used amount of the photoresist 13. It follows that it is possible to reduce a material cost and a degasification amount of the photoresist 13. As a result, it is possible to reduce an adverse effect on an organic EL element.

Note that the patterns of the photoresist 13 illustrated in (a) and (b) of FIG. 5 are illustrative only. The photoresist can be appropriately patterned, by taking into consideration the number, layout, model, size, and the like of organic EL panels on a substrate surface.

Meanwhile, (c) and (d) of FIG. 5 are views each illustrating an example in which (i) three sub-pixels are provided so as to be adjacent to each other in the left-right direction of (c) and (d) of FIG. 5 each of which three sub-pixels has a corresponding organic EL element that has a corresponding one of red (R), green (G), and blue (B) luminescent layers, (ii) one (1) pixel of an organic EL display device is made up of the three sub-pixels, and (iii) the photoresist 13 is formed in at least a vapor deposition unnecessary region R2 where the luminescent layers 8R, 8G, and 8B are formed.

As illustrated in (c) and (d) of FIG. 5, it is not necessarily to cover, with the photoresist 13, vapor deposition unnecessary regions R2 where none of luminescent layers 8R, 8G, and 8B having a striped pattern is formed. Accordingly, as illustrated in (c) of FIG. 5, the photoresist 13 can be formed in a stripe shape so as to extend in the left-right direction of (c) of FIG. 5. Alternatively, as illustrated in (d) of FIG. 5, the photoresist 13 can be formed in an island shape.

Note that the above description has discussed cases where the photoresist 13 is not formed within the sealing region which includes the display region R1. Embodiment 1 is not limited to this. For example, it is also possible to form photoresist 13, serving as protrusions, in the sealing region which includes the display region R1, provided that there is no problem on properties of an organic EL display device.

Specifically, for example, in a case where the photoresist 13, serving as protrusions, is patterned and formed between pixels in the display region R1 (luminescent region), the photoresist 13 can function as pillars for preventing the sealing substrate from colliding with and damaging an organic EL element.

In Embodiment 1, the luminescent layers 8R, 8G, and 8B having a striped pattern are formed on the vapor-deposited surface 101a of the substrate 101 by carrying out vapor deposition while (i) scanning the substrate 101 with respect to the mask unit 105 (which is fixed) in the left-right direction of FIG. 13 and (ii) securing the gap G between the vapor-deposited surface 101a of the substrate 101 and the shadow mask 102. However, Embodiment 1 is not limited to this. Alternatively, vapor deposition can be carried out while sliding the substrate 101 in a state in which the vapor-deposited surface 101a of the substrate 101 and the shadow mask 102 are closely contacted.

In such a case, the photoresist 13 can prevent damage on the vapor-deposited surface 101a of the substrate 101 which damage can be caused by close contact between the vapor-deposited surface 101a of the substrate 101 and the shadow mask 102.

In Embodiment 1, the hole injection layer/hole transfer layer, the electron transfer layer, and the electron injection layer are vapor-deposited with the use of a shadow mask (open mask). Note, however, that these layers can be formed by the vapor deposition method illustrated in FIG. 13 or FIG. 14 as in the case of the luminescent layers. In this case, a mask having an opening corresponding to an entire surface of the display region R1 is used instead of the mask for forming the striped pattern.

In Embodiment 1, the hole injection layer/hole transfer layer, the electron transfer layer, and the electron injection layer are subjected to vapor deposition with the use of an open mask. Note, however, that in a case where there exists another means for connecting the second electrode to the wiring of the substrate 3, the hole injection layer/hole transfer layer, the electron transfer layer, and the electron injection layer can be formed, without the use of the open mask, in a manner similar to the second electrode.

Figure 18:
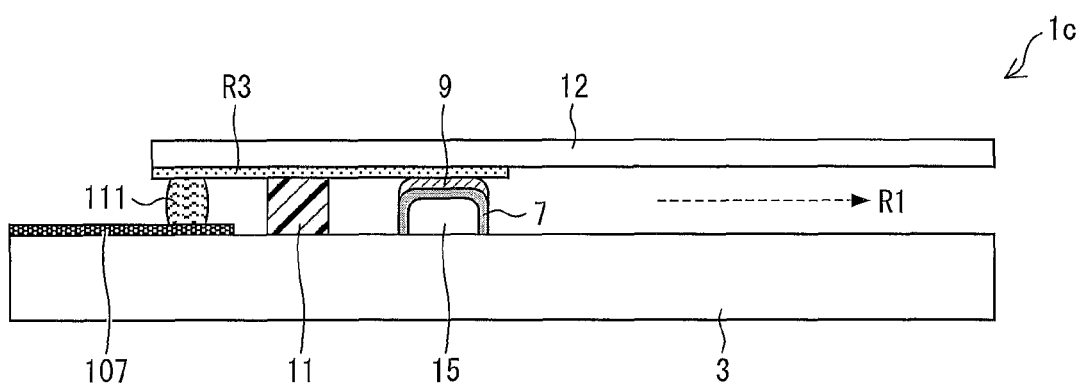
FIG. 18 is a view illustrating an example of how a second electrode and an external wire are electrically connected to each other in a case where a hole injection layer, a hole transfer layer, an electron transfer layer, and an electron injection layer are formed, without the use of a shadow mask, in shapes identical to the second electrode while using a photoresist as a mask in the method for producing an organic EL display device in accordance with the embodiment of the present invention.

FIG. 18 is a view illustrating an example of how the second electrode is electrically connected to external wiring in a case where the hole injection layer, the hole transfer layer, the electron transfer layer, and the electron injection layer are formed, without the use of a shadow mask (open mask), in shapes identical to the second electrode while using a photoresist as a mask.

In Embodiment 1, a protrusion 15 illustrated in FIG. 18 is formed with the use of the photoresist 13. However, Embodiment 1 is not limited to this. Alternatively, a protrusion 15 can be formed with the use of a layer where the edge covers 6 are formed illustrated in (a) of FIG. 12.

Alternatively, the protrusion 15, the photoresist 13, and the edge covers 6 can be formed in a single layer.

As illustrated in FIG. 18, the hole injection layer/hole transfer layer 7, the electron transfer layer (not illustrated), the electron injection layer (not illustrated), and the second electrode 9 are formed on/above the protrusion 15.

On a surface of the sealing substrate 12 which surface faces the substrate 3, a wiring/second electrode connection section R3 made of an electrically conductive material is formed. The wiring/second electrode connection section R3 is electrically connected to the second electrode 9 within the display region R1. The wiring/second electrode connection section R3 is drawn out, via a wire, toward outside of the sealing region surrounded by the sealing resin 11 which is formed in a frame shape.

The wiring/second electrode connection section R3 is connected to a wire 107 of the substrate 3 via a conductive film 111.

With the structure, a second electrode can be connected to an external circuit even in a case where a hole injection layer, a hole transfer layer, an electron transfer layer, and an electron injection layer are formed, without the use of a shadow mask (open mask), in shapes identical to the second electrode while using a photoresist as a mask.

That is, the second electrode and the organic layers other than luminescent layers can be formed in a predetermined shape without the use of a mask.

According to the process (see FIG. 18) for producing an organic EL display device 1c, it is possible to (i) prevent a pattern formed on a substrate from being damaged due to contact with a vapor deposition mask and (ii) use the photoresist 13 as a vapor deposition mask. This allows (i) a reduction in attachment time of the vapor deposition mask, which leads to an improvement in device tact and (ii) a reduction in facility cost. As a result, it is possible to reduce a cost of the organic EL display device 1c.

Furthermore, in a case where the luminescent layers are formed while securing the gap G between the substrate and the vapor deposition mask (see FIG. 13 or FIG. 14), the vapor deposition mask never make contact with the substrate throughout the process for producing an organic EL element. This eliminates the risk that a pattern formed on the substrate is damaged due to contact with the vapor deposition mask. It is therefore possible to further improve yield of the organic EL display device 1c.

[Embodiment 2]

Next, Embodiment 2 of the present invention will be described below with reference to FIGS. 6 through 8. Embodiment 2 is different from Embodiment 1 in that (i) a sealing film is formed, while using a photoresist 13 as a mask, after a step of forming an organic layer including luminescent layers 8R, 8G, and 8B, (ii) the photoresist 13 is peeled off, and then (iii) an organic EL element is sealed with the use of a sealing substrate. Embodiment 2 is similar to Embodiment 1 except for the differences (i) through (iii). For convenience, members that have functions identical to those illustrated in the drawings of Embodiment 1 are given identical reference numerals, and are not described repeatedly.

Figure 8:
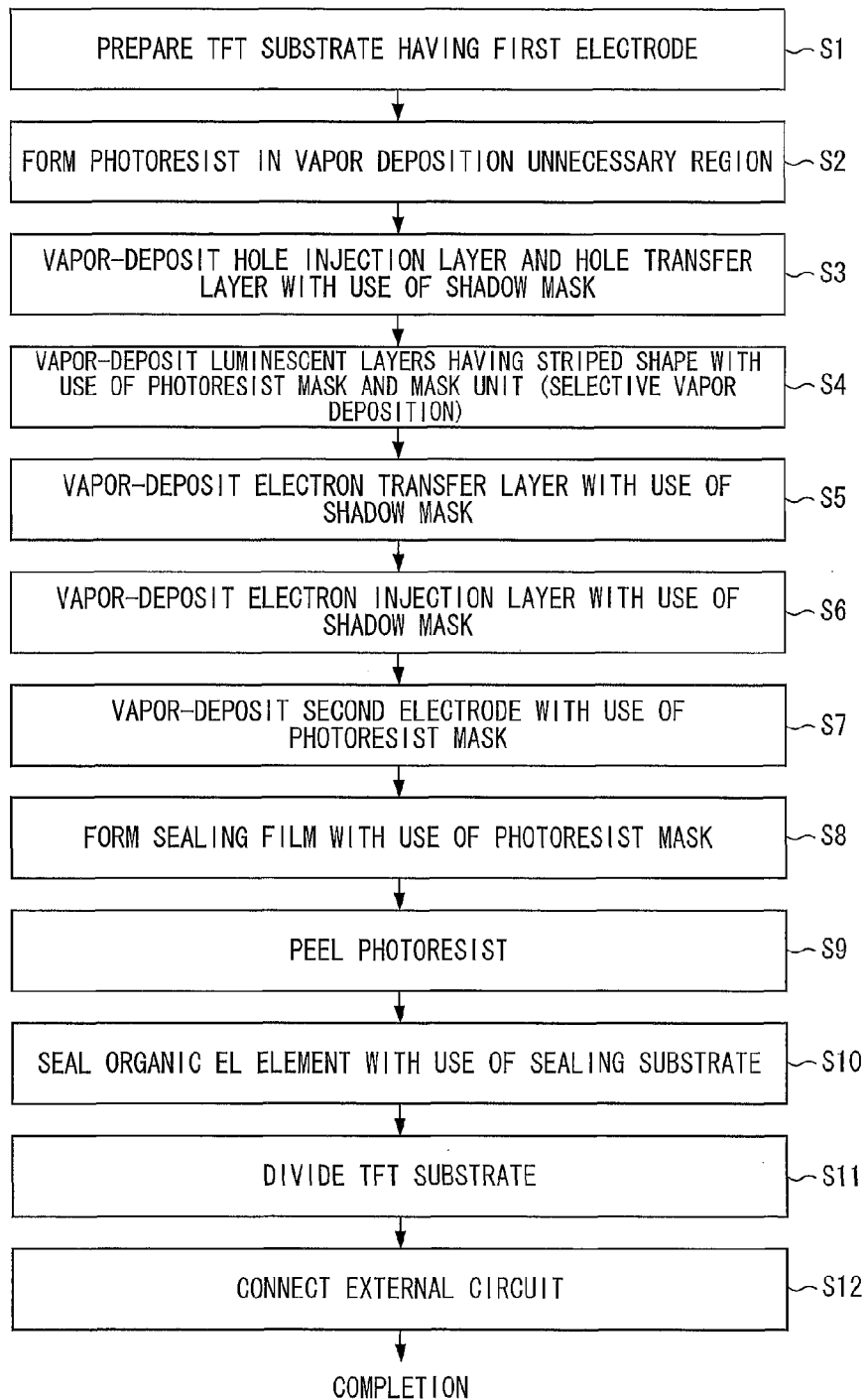
FIG. 8 is a flow chart showing steps of the method for producing an organic EL display device in accordance with the another embodiment of the present invention.

FIG. 8 is a flowchart schematically showing steps of a process for producing an organic EL display device 1a.

Steps S1 through S7 in FIG. 8 are identical to those of FIG. 3 of Embodiment 1, and therefore are not described repeatedly.

Figure 6:
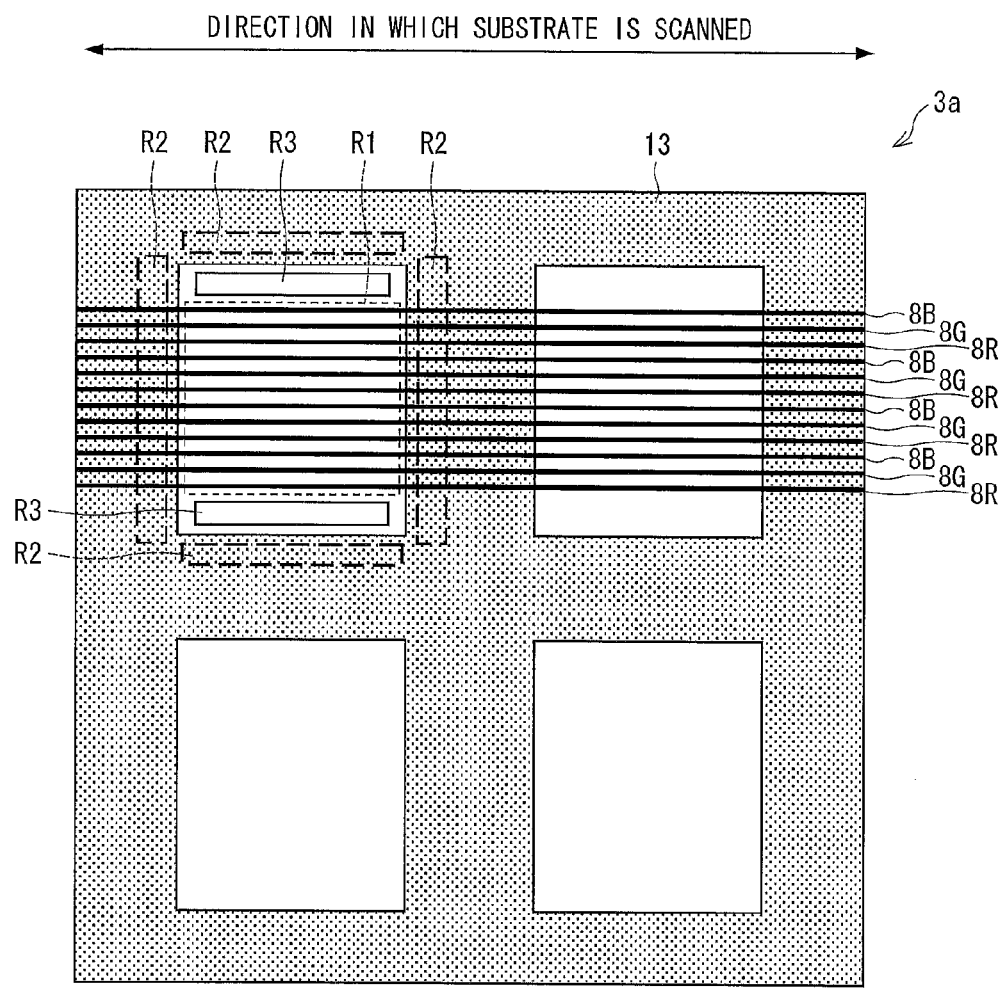
FIG. 6 is a view illustrating how (i) a photoresist is patterned and formed on a substrate and (ii) luminescent layers are formed on the substrate in the method for producing an organic EL display device in accordance with another embodiment of the present invention.

FIG. 6 is a view illustrating how (i) a photoresist 13 is patterned and formed on a substrate 3a on which the organic EL display device 1a is provided and (ii) luminescent layers 8R, 8G, and 8B are formed.

Then, an organic EL element is sealed by (i) forming, on a second electrode which serves as a top surface of the organic EL element, a dense sealing film (not illustrated) which is difficult for moisture and oxygen to pass through by a CVD method or the like while using the photoresist 13 illustrated in FIG. 6 as a mask and (ii) forming, on side surfaces of the organic EL element, a sealing resin or fritted glass (powder glass) in a frame shape (S8).

In Embodiment 2, the luminescent layers 8R, 8G, and 8B, the second electrode, and the sealing film are formed by using the photoresist 13 as a mask. However, Embodiment 2 is not limited to this. As described in Embodiment 1, organic layers other than the luminescent layers 8R, 8G, and 8B also can be formed by using the photoresist 13 alone or the photoresist 13 in combination with an open mask.

Next, the photoresist 13 is peeled off (S9). Since the organic EL element is protected by the sealing film etc. as described above, the organic EL element is not damaged in the step of peeling the photoresist 13 off.

Next, a sealing region, including a display region R1, on the substrate 3a that has been subjected to vapor deposition is sealed so that the organic EL element, including (a) a first electrode, (b) a hole injection layer/hole transfer layer, (c) the luminescent layers 8R, 8G, and 8B, (d) an electron transfer layer, (e) an electron injection layer, and (f) the second electrode, does not deteriorate due to moisture and oxygen in the atmosphere (S10).

As illustrated in FIG. 7, a sealing resin 11 is formed in a frame shape so as to surround four sides of the sealing region including the display region R1, and the substrate 3a is combined with a sealing substrate (not illustrated) via the sealing resin 11.

Then, the substrate 3a is divided into organic EL panels (S11). Each of the organic EL panels is connected to an external circuit (driving circuit) via a terminal section formed in a vapor deposition unnecessary region R2 (S12). The organic EL display device 1a is thus completed.

In the organic EL display device 1a thus prepared, no vapor-deposited film is formed in the vapor deposition unnecessary region R2. This easily solves the problem of formation of a vapor-deposited film in the vapor deposition unnecessary region R2, as in the case of Embodiment 1.

Furthermore, since the photoresist 13 can be used as a vapor deposition mask, it is possible to (i) reduce an attachment time of a vapor deposition mask, thereby improving a device tact and (ii) reduce a facility cost. As a result, it is possible to reduce a cost of the organic EL display device 1a.

At the same time, it is possible to reduce the number of closely contacts of a mask with the substrate 3a. This makes it possible to reduce damage on a surface of an organic EL panel. This gives rise to an improvement in yield of the organic EL display device 1a.

In Embodiment 2, the second electrode and the sealing film are formed by use of a vapor deposition method. The present embodiment is, however, not limited to this. Alternatively, the second electrode and the sealing film can be formed by another film formation method such as a sputtering method.

In a case where formation of the second electrode alone can protect the organic EL element in the step of peeling the photoresist 13 off, the step of forming the sealing film can be omitted.

Note also that a periphery of the sealing region surrounded by the sealing resin 11 in FIG. 7 is also within the vapor deposition unnecessary region R2 and is protected by the photoresist 13 (see FIG. 6).

This makes it possible to prevent a vapor-deposited film from intervening (being sandwiched) between substrates in the periphery of the sealing region, in a case where the organic EL element is sealed by the sealing resin 11 or fritted glass (powder glass) which is formed in a frame shape or in a case where the organic EL element is sealed by combining a sealing substrate and a TFT substrate via the sealing resin 11.

It is therefore possible to improve a closely contact of the sealing resin 11 or fritted glass and to prevent occurrence of vacancy. This makes it possible to sufficiently achieve sealing performance. This ultimately allows a further improvement in reliability of the organic EL display device 1a.

[Embodiment 3]

Next, Embodiment 3 of the present invention will be described below with reference to FIGS. 9 through 11. The present embodiment is different from Embodiment 1 in that (i) a photosensitive dry film 14 is employed as a pattern film instead of the photoresist 13 and (ii) a second electrode is formed after a step of peeling the photosensitive dry film 14 off.

Furthermore, Embodiment 3 is different from Embodiment 1 in that the photosensitive dry film 14 is employed as a mask to form, without the use of a vapor deposition mask, organic layers other than luminescent layers 8R, 8G, and 8B.

Note that Embodiment 3 is different from Embodiment 1 in that the photosensitive dry film 14 (i) covers even a frame-shaped region in which a sealing resin is to be applied and (ii) merely has openings which face respective display regions R1.

Embodiment 3 is similar to Embodiment 1 except for the points mentioned above. For convenience, members that have functions identical to those illustrated in the drawings of Embodiment 1 are given identical reference numerals, and are not described repeatedly.

Figure 11:
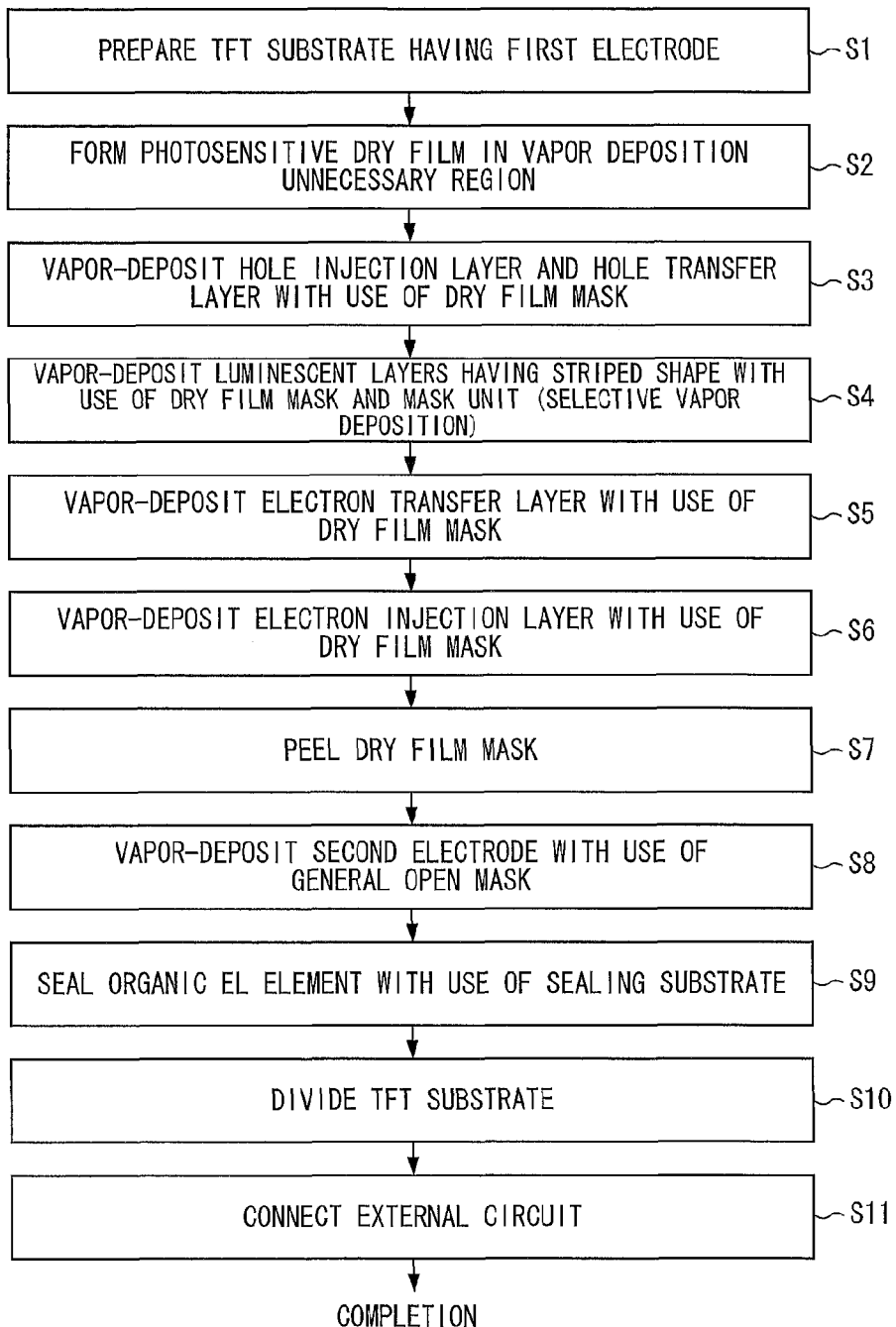
FIG. 11 is a flow chart showing steps of the method for producing an organic EL display device in accordance with the still another embodiment of the present invention.

FIG. 11 is a flowchart schematically showing steps of a process for producing an organic EL display device 1b.

S1, S2, and S4 of FIG. 11 are respectively identical to S1, S2, and S4 of FIG. 3 of Embodiment 1, except that (i) the photosensitive dry film 14 is employed as a pattern film instead of the photoresist 13 and (ii) the photosensitive dry film 14 is employed as a mask to form vapor-deposited films. Therefore, S1, S2, and S4 of FIG. 11 are not described repeatedly.

S3, S5, and S6 of FIG. 11 are analogous to S7 of FIG. 3 of Embodiment 1. Specifically, a hole injection layer/hole transfer layer, an electron transfer layer, and an electron injection layer are formed while using, as a mask, the photosensitive dry film 14 that merely has openings which face the respective display regions R1. Since the photosensitive dry film 14 covers second electrode connection sections R3, no organic layer is formed on the second electrode connection sections R3.

Figure 9:
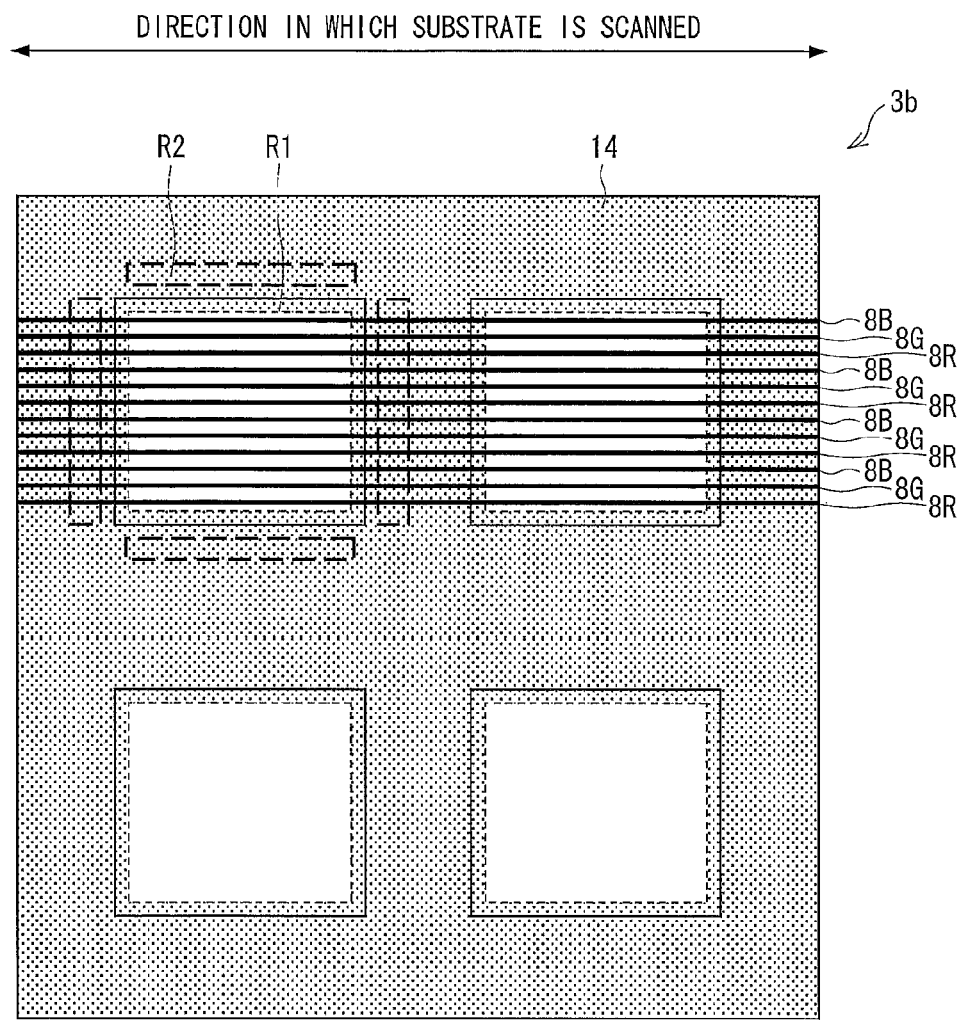
FIG. 9 is a view illustrating how (i) a photosensitive dry film is patterned and formed on a substrate and (ii) luminescent layers are formed on the substrate in the method for producing an organic EL display device in accordance with still another embodiment of the present invention.

FIG. 9 is a view illustrating how (i) the photosensitive dry film 14 is patterned and formed on a substrate 3b and (ii) the luminescent layers 8R, 8G, and 8B are formed.

As illustrated in FIG. 9, the photosensitive dry film 14 is formed so as to have openings which face the respective display regions R1.

A negative-type photosensitive dry film 14 is employed in Embodiment 3. The photosensitive dry film 14 has a film shape, and, can be mechanically peeled off while maintaining a film shape after pattern formation.

Since no exfoliative solution is used in such a peeling step, films, which have been vapor-deposited and constitute an organic EL element, are not damaged even in a case where the organic EL element is not sealed.

In the process of Embodiment 3 for producing the organic EL display device 1b, the photosensitive dry film 14 is peeled off before a second electrode is formed as illustrated in FIG. 11 (S7).

Since the photosensitive dry film 14 has been peeled off, the second electrode is then subjected to vapor deposition while using a general open mask (a shadow mask having an opening in a region including a corresponding display region R1 and corresponding second electrode connection sections R3) (S8).

Next, a sealing region, including a display region R1, on the substrate 3b that has been subjected to vapor deposition is sealed so that the organic EL element, including (a) a first electrode, (b) a hole injection layer/hole transfer layer, (c) the luminescent layers 8R, 8G, and 8B, (d) an electron transfer layer, (e) an electron injection layer, and (f) the second electrode, does not deteriorate due to moisture and oxygen in the atmosphere (S9).

Figure 10:
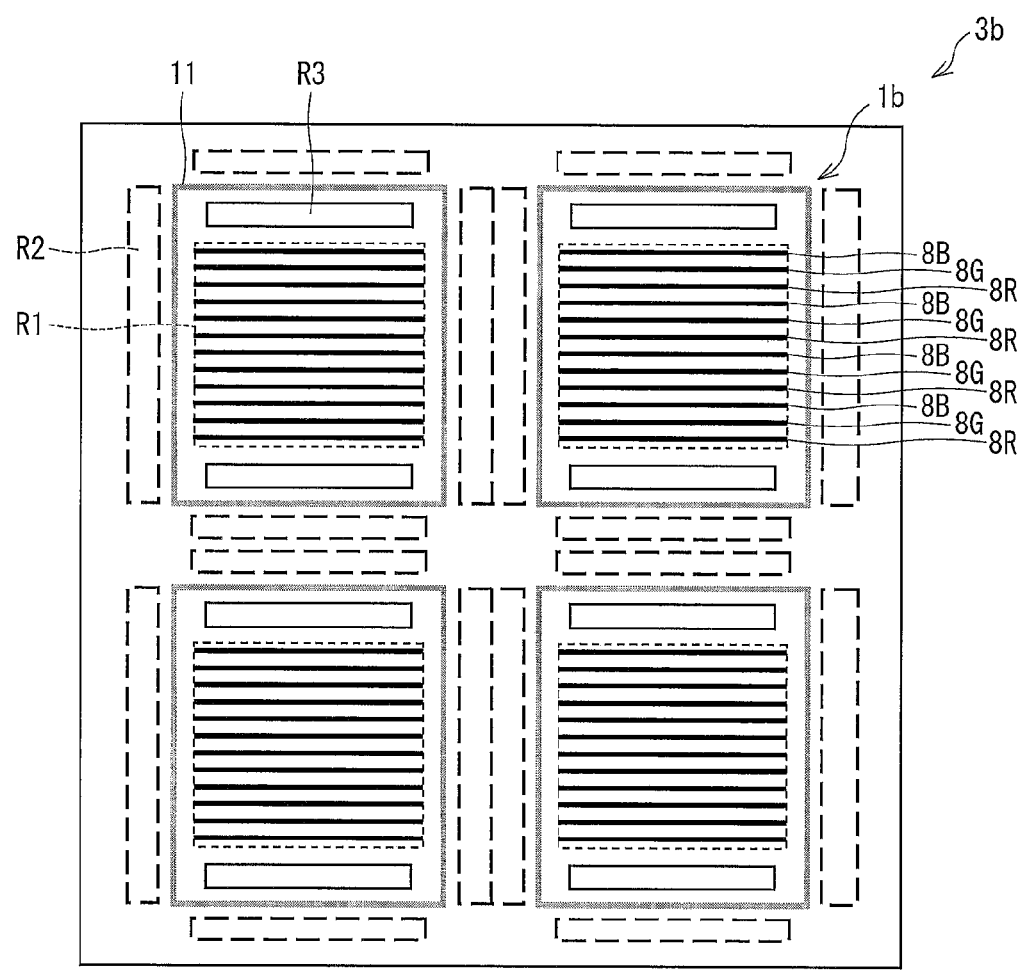
FIG. 10 is a view illustrating the substrate obtained by (i) peeling off the photosensitive dry film, (ii) carrying out vapor deposition with respect to the second electrode, and then (iii) sealing the sealing region in the method for producing an organic EL display device in accordance with the still another embodiment of the present invention.

FIG. 10 is a view illustrating the substrate 3b obtained by (i) peeling off the photosensitive dry film 14, (ii) carrying out vapor deposition with respect to the second electrode, and then (iii) sealing the sealing region including the display region R1.

As illustrated in FIG. 10, the sealing resin 11 is formed in a frame shape so as to surround four sides of the sealing region including the display region R1, and the substrate 3b is combined with a sealing substrate (not illustrated) via the sealing resin 11.

The substrate 3b is divided into organic EL panels (S10). Each of the organic EL panels is connected to an external circuit (driving circuit) via a terminal section formed in the vapor deposition unnecessary region R2 (S11). The organic EL display device 1b is thus completed.

In the organic EL display device 1b thus produced, no vapor-deposited film is formed in the vapor deposition unnecessary region R2. This easily solves the problem of formation of a vapor-deposited film in the vapor deposition unnecessary region R2, as in the case of Embodiments 1 and 2.

Further, since the photosensitive dry film 14 can be used as a vapor deposition mask for organic films including the luminescent layers 8R, 8G, and 8B, it is possible to (i) reduce an attachment time of the vapor deposition mask, thereby improving a device tact and (ii) reduce a facility cost. As a result, it is possible to reduce a cost of the organic EL display device 1b.

At the same time, it is possible to reduce the number of closely contacts of a mask with the substrate 3b. This makes it possible to reduce damage on a surface of the organic EL panel. This gives rise to an improvement in yield of the organic EL display device 1b.

Note also that a periphery (a frame-shaped region in which a sealing resin is to be formed) of the sealing region surrounded by the sealing resin 11 is also within the vapor deposition unnecessary region R2 and is protected by the photosensitive dry film 14 (see FIGS. 9 and 10).

This makes it possible to prevent a vapor-deposited film from intervening (being sandwiched) between substrates in the periphery of the sealing region, in a case where the organic EL element is sealed by the sealing resin 11 or fritted glass (powder glass) which is formed in a frame shape or in a case where the organic EL element is sealed by combining a sealing substrate and a TFT substrate via the sealing resin 11.

It is therefore possible to improve a closely contact of the sealing resin 11 and fritted glass and to prevent occurrence of vacancy. This makes it possible to sufficiently achieve sealing performance. This ultimately allows a further improvement in reliability of the organic EL display device 1b.

The method of the present invention for forming vapor-deposited films is preferably arranged to further include the step of: (d) forming a first film different from the vapor-deposited films before and/or after the step (b), while using the pattern film as a mask, the step (c) being carried out after the step (d).

According to the method, after the formation of the pattern film, the pattern film can be used as a vapor deposition mask. This makes it possible to carry out mask-less vapor deposition. This (i) allows a reduction in attachment time of the vapor deposition mask, which leads to an improvement in device tact and (ii) a reduction in facility cost.

At the same time, it is possible to reduce the number of closely contacts of the vapor deposition mask with the substrate, leading to a reduction in damage on a surface of the substrate.

The method of the present invention for forming vapor-deposited films is preferably arranged to further include the step of: (e) forming a second film different from the vapor-deposited film before and/or after the step (b), while using a mask having a through-hole, the step (c) being carried out after the step (e).

According to the method, the mask having the through-hole is closely contacted with the substrate via the pattern film. Since the pattern film serves as a protection film for the substrate, it is possible to reduce damage on the surface of the substrate.

The method of the present invention for forming vapor-deposited films is preferably arranged such that the pattern film is formed by exposing a photosensitive material and then developing the photosensitive material.

According to the method, the pattern film can be patterned relatively easily, and can be peeled off with the use of an exfoliative solution.

The method of the present invention for forming vapor-deposited films is preferably arranged such that the pattern film is a dry film that can be peeled off while maintaining a film shape.

According to the method, the pattern film can be peeled off while maintaining a film shape without the use of an exfoliative solution. This makes it possible to suppress an adverse effect that can occur in the case where the exfoliative solution is used.

The method of the present invention for forming vapor-deposited films is preferably arranged such that the pattern film is made of a heat-resisting material which does not produce resolvent in the post-process of the step (a).

According to the method, it is possible to suppress an influence of the pattern film in the post-process.

The method of the present invention for forming vapor-deposited films is preferably arranged such that in the step (b), the vapor-deposited films are formed by scanning at least one of the substrate and a mask unit with respect to the other, the mask unit including (i) a vapor deposition mask which has a through-hole and is smaller in area than the substrate and (ii) a vapor deposition material supply source, and having (iii) injection holes from which vapor deposition particles supplied from the vapor deposition material supply source are injected, via the vapor deposition mask, towards the surface of the substrate on which surface the pattern film is formed, a relative location of the vapor deposition mask and the injection holes being fixed, a predetermined gap being secured between the substrate and the vapor deposition mask of the mask unit.

According to the method, the vapor-deposited films that have a linear shape and that are provided at certain intervals can be efficiently formed with high definition.

The method of the present invention for forming vapor-deposited films may be arranged such that the vapor deposition mask of the mask unit and the substrate are closely contacted.

According to the method, the substrate and the vapor deposition mask are closely contacted via the pattern film. This allows the pattern film to prevent the vapor deposition mask from damaging the substrate.

The method of the present invention for producing a display device is preferably arranged so as to further include the step of: (g) forming at least one of (i) an organic layer other than the luminescent layers and (ii) an inorganic layer including a metal layer, while using the pattern film as a mask.

According to the method, the pattern film can be used as a mask in the step of forming at least one layer selected from an organic layer other than the luminescent layer, a metal layer, and an inorganic layer. Since mask-less vapor deposition can be carried out in the step of forming these films, it is possible to (i) reduce an attachment time of the mask, thereby improving a device tact and (ii) reduce a facility cost.

At the same time, it is possible to reduce the number of closely contacts of the mask with the substrate, thereby reducing damage on the surface of the substrate.

According to the method, it is therefore possible to improve yield and reliability and to suppress a production cost.

The method of the present invention for producing a display device is preferably arranged so as to further include the step of: (h) forming at least one of (i) an organic layer other than the luminescent layers and (ii) an inorganic layer including a metal layer, while using a mask having a through-hole.

According to the method, the mask having the through-hole is closely contacted with the substrate via the pattern film. Since the pattern film serves as a protection film for the substrate, it is possible to reduce damage on the surface of the substrate. It is therefore possible to provide a method for producing a display device that is improved in yield and reliability.

The method of the present invention for producing a display device is preferably arranged such that the pattern film is peeled off after the step (d), and in the step (d), the second electrode is formed while using the pattern film as a mask.

Since the pattern film can be used as a mask in the step of forming the second electrode, the step of forming the second electrode can be carried out without the use of a mask. This makes it possible to (i) reduce an attachment time of the mask, thereby improving a device tact and (ii) reduce a facility cost.

At the same time, it is possible to reduce the number of closely contacts of a vapor deposition mask with the substrate, thereby reducing damage on the surface of the substrate.

The method of the present invention for producing a display device is preferably arranged such that, in the step (d), the second electrode is formed while using a mask having a through-hole.

According to the method, the second electrode is formed with the use of the mask having the through-hole. This makes it possible to form the second electrode so that no organic layer is interposed between a wire connection section and the second electrode.

The method of the present invention for producing a display device is preferably arranged to further include the step of: (i) sealing the first electrodes, the organic layers, and the second electrode with use of a sealing member, the pattern film being peeled off after the step (i).

According to the method, the pattern film is peeled off in a state in which the first electrodes, the organic layers, and the second electrode are sealed by the sealing member. This makes it possible to suppress an adverse effect caused by the exfoliative solution.

The method of the present invention for producing a display device is preferably arranged to further include the steps of: (j) forming a sealing film for sealing the first electrodes, the organic layers, and the second electrode, before the pattern film is peeled off, while using the pattern film as a mask; and (k) sealing the first electrodes, the organic layers, the second electrode, and the sealing film with use of a sealing member, after the pattern film is peeled off.

According to the method, the pattern film is peeled off in a state in which the first electrodes, the organic layers, and the second electrode are sealed by the sealing film. This makes it possible to suppress an adverse effect caused by the exfoliative solution.

Further, it is possible to improve reliability since the first electrodes, the organic layers, and the second electrode are sealed not only by the sealing film, but also by the sealing member.

The method of the present invention for producing a display device is preferably arranged such that the pattern film is formed by exposing a photosensitive material and then developing the photosensitive material.

According to the method, the pattern film can be relatively easily patterned and can be peeled off with the use of an exfoliative solution.

The method of the present invention for producing a display device is preferably arranged such that after the pattern film is peeled off, the first electrodes, the organic layers, and the second electrode are sealed with use of a sealing member, in a case where the pattern film is a dry film that can be peeled off while maintaining a film shape and that is formed by exposing a photosensitive material and then developing the photosensitive material.

According to the method, the pattern film can be peeled off without the use of the exfoliative solution. This makes it possible to peel off the pattern film before the step of sealing the first electrodes, the organic layers, and the second electrode with use of the sealing member.

The method of the present invention for producing a display device is preferably arranged such that the pattern film is made of a heat-resisting material that does not produce a resolvent in the post-process of the step (e).

According to the method, it is possible to suppress an influence of the resolvent produced by the pattern film in the post-process.

The method of the present invention for producing a display device is preferably arranged to further include the step of: (l) forming, in a part of the display region, a protrusion for supporting the sealing member before the step of sealing the first electrodes, the organic layers, and the second electrode with use of a sealing member.

The protrusion formed according to the method makes it possible to prevent the organic layers, the second electrode, or the like from making contact with and being damaged by the sealing member, for example, through pressing on the sealing member.

The method of the present invention for producing a display device is preferably arranged such that the second electrode is provided on the protrusion.

In a case where a shape of the second electrode is identical to that of the organic layer other than the luminescent layers, a bottom surface of the second electrode is entirely covered by the organic layer. Accordingly, the organic layer intervenes between external wiring and the second electrode. It was therefore difficult to electrically connect the external wiring and the second electrode.

According to the method, even in a case where a shape of the second electrode is identical to that of the organic layer other than the luminescent layers, the second electrode provided on the protrusion can be electrically connected, via a wire provided on the sealing member side, to a wire provided on the substrate side.

The method of the present invention for producing a display device is preferably arranged such that the protrusion and the pattern film are formed in a single step.

According to the method, the protrusion is formed in the step of forming the pattern film. This eliminates the need for an additional step for forming the protrusion.

The method of the present invention for producing a display device is preferably arranged such that the pattern film and edge covers for covering end parts of the first electrodes are formed in a single step.

According to the method, the pattern film is formed in the step of forming the edge covers. This eliminates the need for an additional step for forming the pattern film.

The method of the present invention for producing a display device is preferably arranged such that in the step (f), at least the luminescent layers are formed by scanning at least one of the substrate and a mask unit with respect to the other, the mask unit including (i) a vapor deposition mask which has a through-hole and is smaller in area than the substrate and (ii) a vapor deposition material supply source, and having (iii) injection holes from which vapor deposition particles supplied from the vapor deposition material supply source are injected, via the vapor deposition mask, towards the surface of the substrate on which surface the pattern film is formed, a relative location of the vapor deposition mask and the injection holes being fixed, a predetermined gap being secured between the substrate and the vapor deposition mask of the mask unit.

According to the method, it is possible to provide an efficient method for producing a display device that is improved in yield and reliability.

The method of the present invention for producing a display device may be arranged such that the vapor deposition mask of the mask unit and the substrate are closely contacted.

According to the method, the substrate and the vapor deposition mask are closely contacted via the pattern film. Accordingly, the pattern film can prevent the vapor deposition mask from damaging the substrate.

The method of the present invention for producing a display device is preferably arranged such that the pattern film is formed also in a part of the non-display region which is on the periphery of the display region in which part the sealing member is to be formed.

According to the method, it is possible to prevent the vapor-deposited film from intervening (being sandwiched) between the substrates in a region in which the sealing member is formed. This makes it possible to improve a degree of contact of the sealing member and to prevent occurrence of vacancy, thereby sufficiently achieving sealing performance. As a result, it is possible to further improve reliability of the organic EL display device.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is suitably applicable, for example, to a process for producing an organic EL display device.

REFERENCE SIGNS LIST 1, 1a, 1b, 1c: Organic EL display device (display device)
2: TFT (active element)
3, 3a, 3b: Substrate
5: First electrode
7: Hole injection layer/hole transfer layer (organic layer)
8R, 8G, 8B: Luminescent layer
9: Second electrode
10: Organic EL element
11: Sealing resin (sealing member)
12: Sealing substrate (sealing member)
13: photoresist (pattern film)
14: Photosensitive dry film (pattern film)
15: Protrusion
R1: Display region
R2: Vapor deposition unnecessary region (non-display region)
R3: Second electrode connection section

The invention claimed is:

1. A method for forming, on a substrate, vapor-deposited films each having a predetermined shape,
the method comprising the steps of:
(a) forming, on a surface of the substrate on which surface the vapor-deposited film are to be formed, a pattern film of a predetermined shape which has an opening and which can be peeled off;
(b) forming, on the opening and the pattern film, the vapor-deposited films, having a linear shape, that extend in a direction on the substrate and that are provided at certain intervals; and
(c) peeling the pattern film off from the substrate so that the vapor-deposited films are formed in the predetermined shape,
in the step (b),
a mask unit including (i) a vapor deposition mask which has a through-hole and is smaller in area than the substrate and (ii) a vapor deposition material supply source, and having (iii) injection holes from which vapor deposition particles supplied from the vapor deposition material supply source are injected, via the vapor deposition mask, towards the surface of the substrate on which surface the pattern film is formed, a relative location of the vapor deposition mask and the injection holes being fixed,
a predetermined gap being secured between the substrate and the vapor deposition mask of the mask unit,
the vapor-deposited films, having the linear shape, that extend in the direction on the substrate being formed on the opening and the pattern film by carrying out vapor deposition while (i) causing the vapor deposition particles to be injected and (ii) scanning at least one of the substrate and the mask unit with respect to the other.

2. The method according to claim 1,
further comprising the step of:
(e) forming a second film different from the vapor-deposited film before and/or after the step (b), while using a mask having a through-hole,
the step (c) being carried out after the step (e).

3. The method according to claim 1, further comprising the step of:
(d) forming a first film different from the vapor-deposited films before and/or after the step (b), while using the pattern film as a mask,
the step (c) being carried out after the step (d).

4. The method according to claim 1, wherein the pattern film is formed by exposing a photosensitive material and then developing the photosensitive material.

5. The method according to claim 4, wherein the pattern film is a dry film that can be peeled off while maintaining a film shape.

6. The method according to claim 1, wherein the pattern film is made of a heat-resisting material which does not produce resolvent in the post-process of the step (a).

7. The method according to claim 1, wherein the vapor deposition mask of the mask unit and the substrate are closely contacted.

8. A method for producing a display device,
the method comprising the steps of:
(a) forming a plurality of active elements on a substrate;
(b) forming first electrodes in a matrix manner in a display region of the substrate, the first electrodes being electrically connected to the respective plurality of active elements;
(c) forming, on the first electrodes, respective organic layers each including luminescent layers; and
(d) forming, at least on the organic layer, a second electrode that has a polarity opposite to those of the first electrodes,
the step (c) including the steps of:
(e) forming, in the display region, an opening of a pattern film that can be peeled off and forming the pattern film in at least part of a non-display region which is on the periphery of the display region; and
(f) forming, on the opening and the pattern film, the at least luminescent layers, each having a linear shape, that are formed at certain intervals and extend in a row direction of or in a column direction of the first electrodes formed in the matrix,
in the step (f),
a mask unit including (i) a vapor deposition mask which has a through-hole and is smaller in area than the substrate and (ii) a vapor deposition material supply source, and having (iii) injection holes from which vapor deposition particles supplied from the vapor deposition material supply source are injected, via the vapor deposition mask, towards the surface of the substrate on which surface the pattern film is formed, a relative location of the vapor deposition mask and the injection holes being fixed, a predetermined gap being secured between the substrate and the vapor deposition mask of the mask unit, the at least luminescent layers, each having the linear shape, that extend in the row direction of or in the column direction of the first electrodes being formed on the opening and the pattern film by carrying out vapor deposition while (i) causing the vapor deposition particles to be injected and (ii) scanning at least one of the substrate and the mask unit with respect to the other, after the formation of the at least luminescent layers in the step (c) or after the step (d), the at least luminescent layers being formed in a predetermined shape by peeling the pattern film off.

9. The method according to claim 8, further comprising the step of:
(g) forming at least one of (i) an organic layer other than the luminescent layers and (ii) an inorganic layer including a metal layer, while using the pattern film as a mask.

10. The method according to claim 9, wherein:
the pattern film is peeled off after the step (d), and
in the step (d), the second electrode is formed while using the pattern film as a mask.

11. The method according to claim 8, further comprising the step of:
(h) forming at least one of (i) an organic layer other than the luminescent layers and (ii) an inorganic layer including a metal layer, while using a mask having a through-hole.

12. The method according to claim 11, wherein, in the step (d), the second electrode is formed while using a mask having a through-hole.

13. The method according to claim 8, further comprising the step of:
(i) sealing the first electrodes, the organic layers, and the second electrode with use of a sealing member,
the pattern film being peeled off after the step (i).

14. The method according to claim 8, further comprising the steps of:
(j) forming a sealing film for sealing the first electrodes, the organic layers, and the second electrode, before the pattern film is peeled off, while using the pattern film as a mask; and
(k) sealing the first electrodes, the organic layers, the second electrode, and the sealing film with use of a sealing member, after the pattern film is peeled off.

15. The method according to claim 8, wherein the pattern film is formed by exposing a photosensitive material and then developing the photosensitive material.

16. The method according to claim 8, wherein:
the pattern film is a dry film that can be peeled off while maintaining a film shape and that is formed by exposing a photosensitive material and then developing the photosensitive material, and
after the pattern film is peeled off, the first electrodes, the organic layers, and the second electrode are sealed with use of a sealing member.

17. The method according to claim 8, wherein the pattern film is made of a heat-resisting material that does not produce a resolvent in the post-process of the step (e).

18. The method according to claim 8, further comprising the step of:
(l) forming, in a part of the display region, a protrusion for supporting the sealing member before the step of sealing the first electrodes, the organic layers, and the second electrode with use of a sealing member.

19. The method according to claim 18, wherein the second electrode is provided on the protrusion.

* * * * *